US012628617B2

(12) United States Patent
Tsai et al.

(10) Patent No.:  US 12,628,617 B2
(45) Date of Patent:      May 12, 2026

(54) WAFER CHUCK INCLUDING SELF-SEALING VACUUM SEAL ASSEMBLIES AND METHODS FOR OPERATING THE SAME

(71) Applicant: Taiwan Semiconductor Manufacturing Company Limited, Hsinchu (TW)

(72) Inventors: Wei-Yu Tsai, Hsinchu (TW); Hung-Jui Kuo, Hsinchu (TW); Ming-Tan Lee, Kaohsiung City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 313 days.

(21) Appl. No.: 18/459,523

(22) Filed: Sep. 1, 2023

(65) Prior Publication Data

US 2025/0079228 A1      Mar. 6, 2025

(51) Int. Cl.
*H01L 21/687* (2006.01)
*G03F 7/00* (2006.01)

(52) U.S. Cl.
CPC .... *H01L 21/68742* (2013.01); *G03F 7/70708* (2013.01)

(58) Field of Classification Search
CPC ........... G03F 7/70708; H01L 21/68742; H01L 21/6838; H01L 21/68735
See application file for complete search history.

(56) References Cited

U.S. PATENT DOCUMENTS

| | | | |
|---|---|---|---|
| 2014/0265097 A1* | 9/2014 | Cuvalci | B25B 11/00 269/53 |
| 2016/0111318 A1* | 4/2016 | Ichinose | G03F 7/70733 269/21 |
| 2019/0027394 A1* | 1/2019 | Sarode Vishwanath | H01L 21/68757 |
| 2020/0035536 A1* | 1/2020 | Eto | H01L 21/6833 |
| 2021/0005504 A1* | 1/2021 | Han | H01L 21/68785 |
| 2022/0293452 A1* | 9/2022 | Sulyman | H01L 21/68742 |
| 2022/0351949 A1* | 11/2022 | Nguyen | H01L 21/67109 |
| 2023/0010075 A1* | 1/2023 | Guan | H01J 37/32715 |
| 2025/0062156 A1* | 2/2025 | Hiester | H01L 21/67748 |

* cited by examiner

*Primary Examiner* — Deoram Persaud
(74) *Attorney, Agent, or Firm* — The Marbury Law Group, PLLC

(57)      ABSTRACT

A semiconductor processing apparatus includes a wafer chuck configured to hold a wafer on a top surface thereof. A plurality of lift-pin holes vertically extends through a chuck body of the wafer chuck. A plurality of lift pins are located in the plurality of lift-pin holes. A plurality of vacuum seal assemblies is located on a bottom portion of a respective one of the plurality of lift pins. Each vacuum seal assembly within the plurality of vacuum seal assemblies includes a respective set of ring segments that are configured to be assembled into a respective contiguous structure under a condition of an upward gas flow within a respective lift-pin hole selected from the plurality of lift-pin holes. Leaks in a vacuum seal between the wafer and the wafer chuck can be remedied by formation of at least one contiguous structure that provides an additional vacuum seal.

20 Claims, 14 Drawing Sheets

Gravity pulls down the ring segments, and the ring segments slide outward

Through-opening gas flow diminishes until the gas flow path is sealed as the ring segments contact the lift pin ring segments move upward and slide inward Through-opening gas flow transfers upward momentum and applies upward force to the ring segments until the gas flow path is sealed Gravity pulls down the ring segments, and the ring segments slide outward

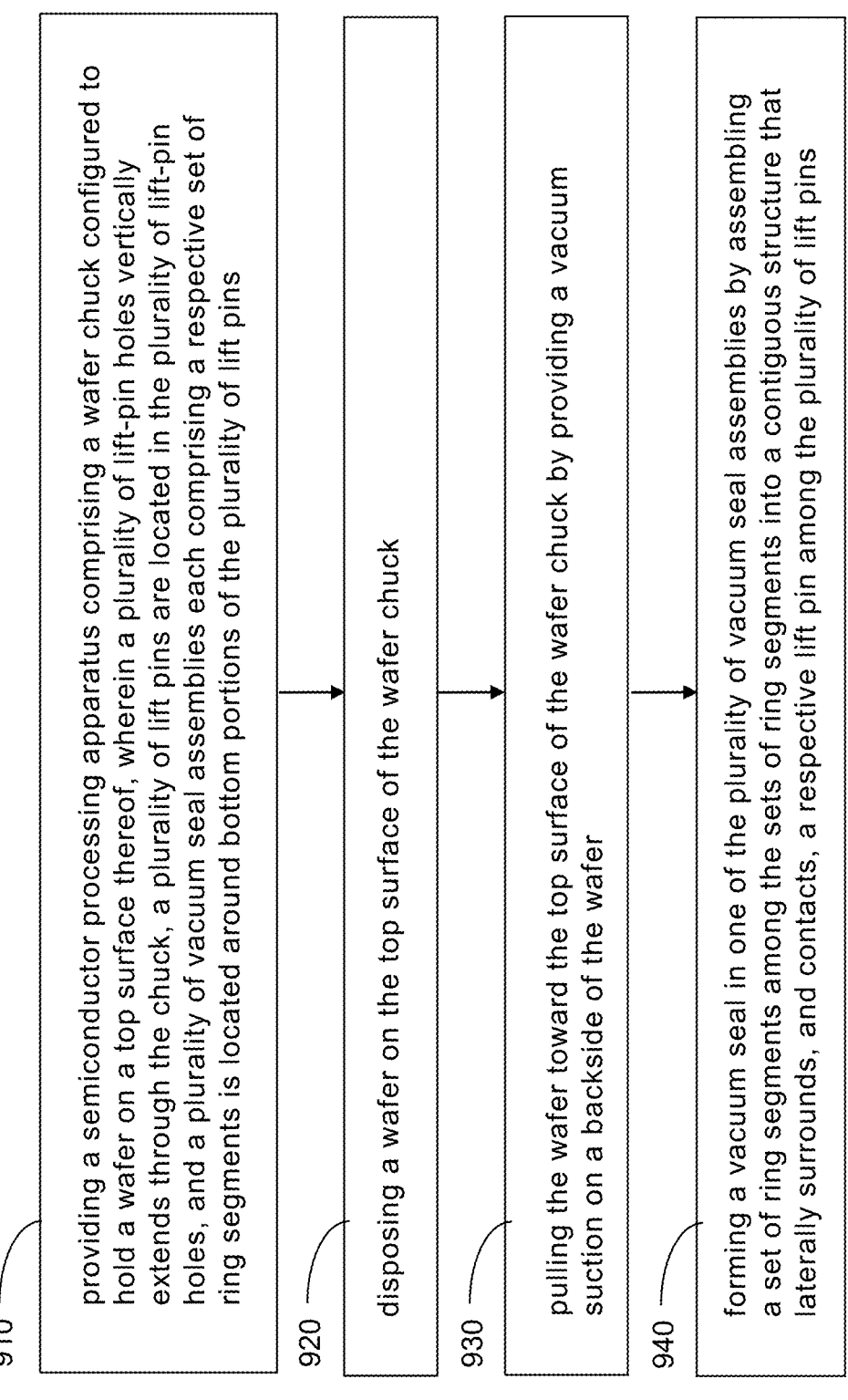

910 providing a semiconductor processing apparatus comprising a wafer chuck configured to hold a wafer on a top surface thereof, wherein a plurality of lift-pin holes vertically extends through the chuck, a plurality of lift pins are located in the plurality of lift-pin holes, and a plurality of vacuum seal assemblies each comprising a respective set of ring segments is located around bottom portions of the plurality of lift pins 920 disposing a wafer on the top surface of the wafer chuck 930 pulling the wafer toward the top surface of the wafer chuck by providing a vacuum suction on a backside of the wafer 940 forming a vacuum seal in one of the plurality of vacuum seal assemblies by assembling a set of ring segments among the sets of ring segments into a contiguous structure that laterally surrounds, and contacts, a respective lift pin among the plurality of lift pins

FIG. 9

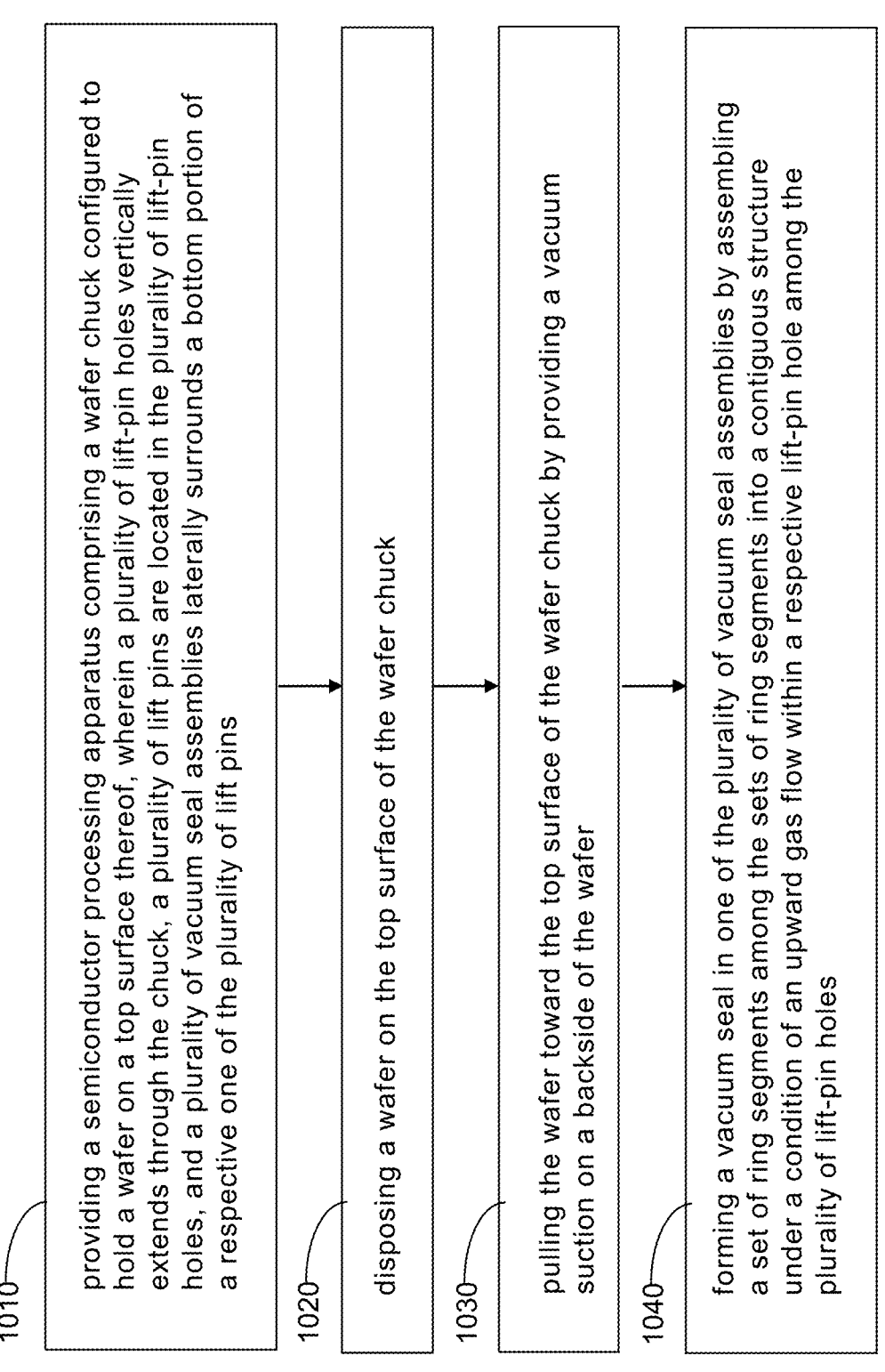

1010 providing a semiconductor processing apparatus comprising a wafer chuck configured to hold a wafer on a top surface thereof, wherein a plurality of lift-pin holes vertically extends through the chuck, a plurality of lift pins are located in the plurality of lift-pin holes, and a plurality of vacuum seal assemblies laterally surrounds a bottom portion of a respective one of the plurality of lift pins 1020 disposing a wafer on the top surface of the wafer chuck 1030 pulling the wafer toward the top surface of the wafer chuck by providing a vacuum suction on a backside of the wafer 1040 forming a vacuum seal in one of the plurality of vacuum seal assemblies by assembling a set of ring segments among the sets of ring segments into a contiguous structure under a condition of an upward gas flow within a respective lift-pin hole among the plurality of lift-pin holes

FIG. 10

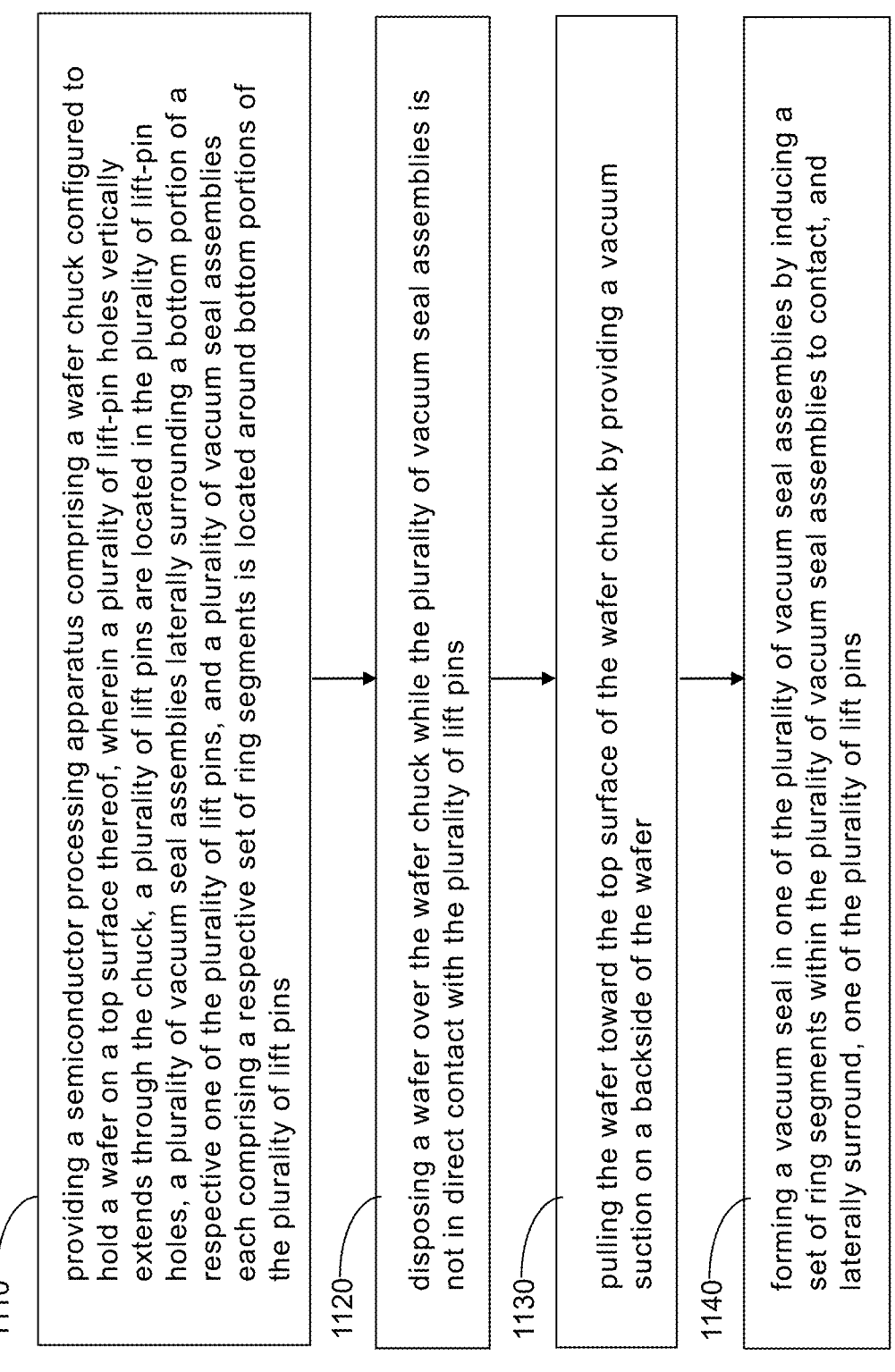

1110 — providing a semiconductor processing apparatus comprising a wafer chuck configured to hold a wafer on a top surface thereof, wherein a plurality of lift-pin holes vertically extends through the chuck, a plurality of lift pins are located in the plurality of lift-pin holes, a plurality of vacuum seal assemblies laterally surrounding a bottom portion of a respective one of the plurality of lift pins, and a plurality of vacuum seal assemblies each comprising a respective set of ring segments is located around bottom portions of the plurality of lift pins 1120 — disposing a wafer over the wafer chuck while the plurality of vacuum seal assemblies is not in direct contact with the plurality of lift pins 1130 — pulling the wafer toward the top surface of the wafer chuck by providing a vacuum suction on a backside of the wafer 1140 — forming a vacuum seal in one of the plurality of vacuum seal assemblies by inducing a set of ring segments within the plurality of vacuum seal assemblies to contact, and laterally surround, one of the plurality of lift pins

FIG. 11

WAFER CHUCK INCLUDING SELF-SEALING VACUUM SEAL ASSEMBLIES AND METHODS FOR OPERATING THE SAME

BACKGROUND

Warpage of wafers increases as the internal structures of packages become more complex. A wafer with high stiffness and negative warpage poses a challenge for vacuum systems due to formation of a non-negligible gap between the wafer and a wafer chuck, and resulting leakage in the vacuum suction.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 is a first flow chart illustrating a set of processing steps for implementing the methods of an embodiment of the present disclosure.

FIG. 10 is a second flow chart illustrating a set of processing steps for implementing the methods of an embodiment of the present disclosure.

FIG. 11 is a third flow chart illustrating a set of processing steps for implementing the methods of an embodiment of the present disclosure.

DETAILED DESCRIPTION

Figure 1:
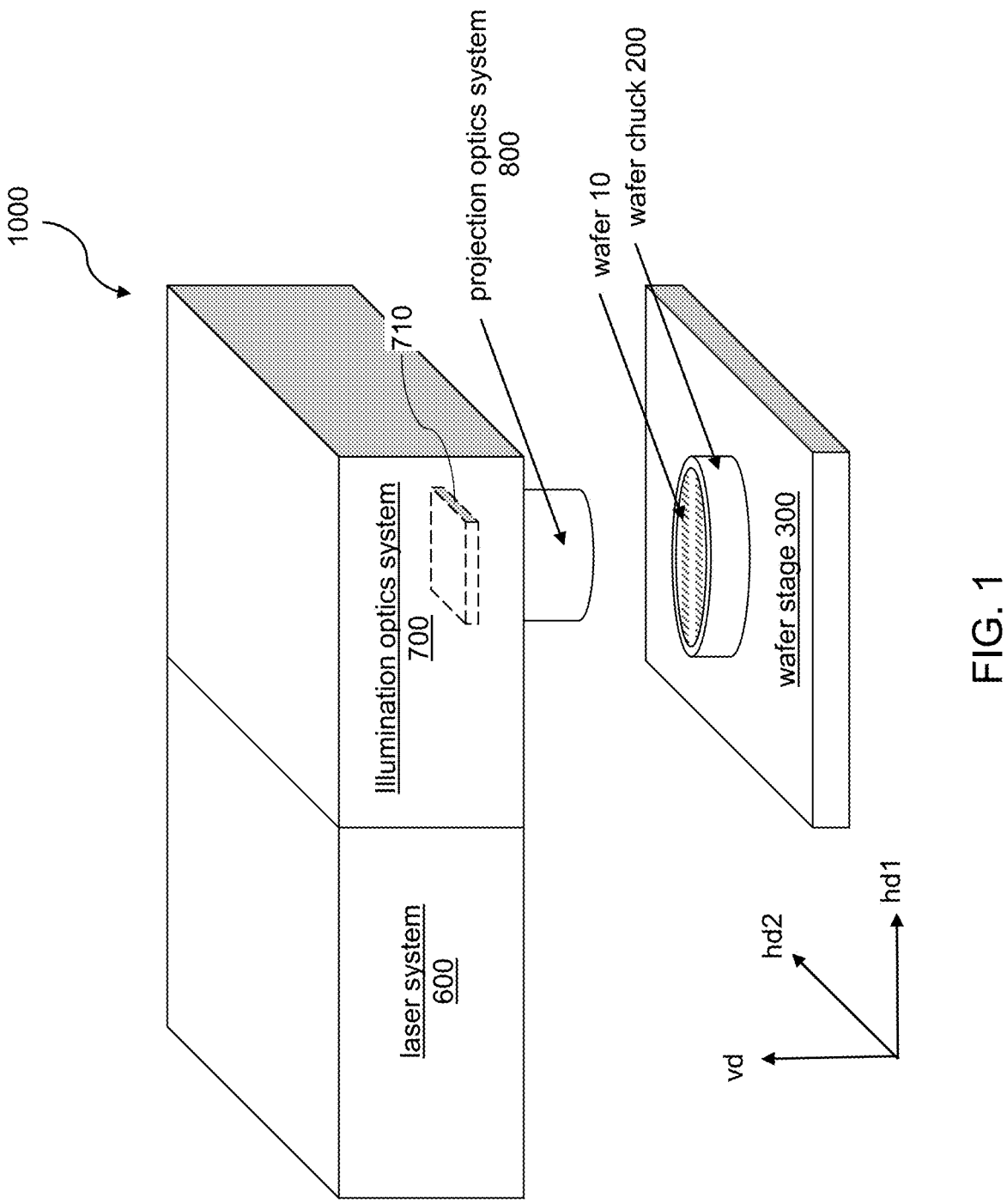
FIG. 1 is a perspective view of an exemplary semiconductor processing apparatus including a wafer chuck according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Same reference numerals refer to the same element or similar elements, and a same material composition and a same function are presumed selected from elements with the same reference numeral unless otherwise stated explicitly.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

A wafer mounted on a wafer chuck may have sufficient wafer deformation such that a gap exists between the wafer and the wafer chuck. Such a gap may provide a lateral air flow path between a lift pin opening through the wafer chuck and a vacuum groove on the top surface of the wafer chuck. In such instances, sufficient air flow through the lift pin opening and the gap into the vacuum groove may cause a failure in the vacuum system that generate vacuum suction on the backside of the wafer. Modification of the wafer chuck itself can be costly and time-consuming.

According to an embodiment of the present disclosure, an add-on component can be attached on the backside of each lift pin opening through a wafer chuck. The add-on component may comprise a set of multiple ring segments that are normally detached from a lift pin and each of the set of multiple ring segments do not contact one another. Upon generation of a condition in which a lateral air flow path is connected to the top of the lift pin opening, the set of multiple ring segments self-assemble to form a vacuum seal structure. Upward air flow in the lift pin hole may be blocked (or at least decreased to a sufficient degree) upon formation of the vacuum seal structure, and vacuum suction may be maintained on the backside of the wafer.

The self-sealing mechanism does not use any external power. Upward air flow during a leakage condition transfers mechanical momentum to the set of multiple ring segments to cause the set of multiple ring segments to become a continuous structure forming the vacuum seal. The vacuum seal may be deactivated before moving the lift pin by equalizing the pressure across the vacuum seal, e.g., by terminating the vacuum suction applied to the backside of the wafer, and the set of multiple ring segments may be detached from the lift pin by gravity. The self-sealing mechanism of various embodiments disclosed herein do not use external power for operation, and may be attached to the backside of a wafer chuck in any manner without modification to the wafer chuck itself. Thus, various embodiments of a self-sealing mechanism disclosed herein may provide a cost-effective and efficient solution for wafer warpage and vacuum fail problems. The various embodiments may be applicable to any wafer chuck that uses vacuum suction and lift pins. Various embodiments of the present disclosure are now described with reference to accompanying drawings.

Referring to FIG. 1, an exemplary structure according to a first embodiment of the present disclosure is illustrated, which comprises a semiconductor processing apparatus 1000 including a wafer chuck 200. The semiconductor processing apparatus 1000 may comprise any of a variety of semiconductor processing apparatus that include a wafer chuck 200 that uses a vacuum system to hold a wafer 10 on a top surface thereof by applying a vacuum suction on a backside of the wafer 10. For example, the semiconductor processing apparatus 1000 may comprise a lithographic processing apparatus, an etch apparatus, or a deposition apparatus. In an illustrative example, in embodiments in which the semiconductor processing apparatus 1000 comprises a lithographic processing apparatus, the lithographic processing apparatus may comprise a laser system 600 configured to generate a laser beam; an illumination optics system 700 comprising a reticle 710 therein and configured to guide the laser beam through the reticle 710; and a projection optics system 800 located between the illumination optics system 700 and the wafer chuck 200 and configured to focus the laser beam onto a respective exposure field on the wafer 10.

While the present disclosure is described using an embodiment in which the semiconductor processing apparatus 1000 comprises a lithographic processing apparatus such as a lithographic exposure tool, various embodiments of the present disclosure may be generally used to provide any semiconductor processing apparatus in which the wafer chuck 200 is provided with at least one vacuum seal assembly to be subsequently described.

In one embodiment, the semiconductor processing apparatus of the present disclosure may comprise a wafer stage 300 configured to provide a two-dimensional lateral movement of the wafer chuck 200 along a first horizontal direction hd1 and along a second horizontal direction hd2. As used herein, a structure is "configured to" provide a functionality if the structure has geometrical features and material properties that are necessary to provide the functionality, i.e., if the structure has structural features that inherently provide the functionality. The wafer stage 300 may be configured to provide a vertical movement to the wafer chuck 200 along a vertical direction vd. The wafer 10 may be attached to the top surface of the wafer chuck 200, and thus, may move in a three dimensional space along the first horizontal direction hd1, the second horizontal direction hd2, and the vertical direction vd. Further, the wafer chuck 200 may be configured to rotate azimuthally around the vertical direction vd.

Figure 2A:
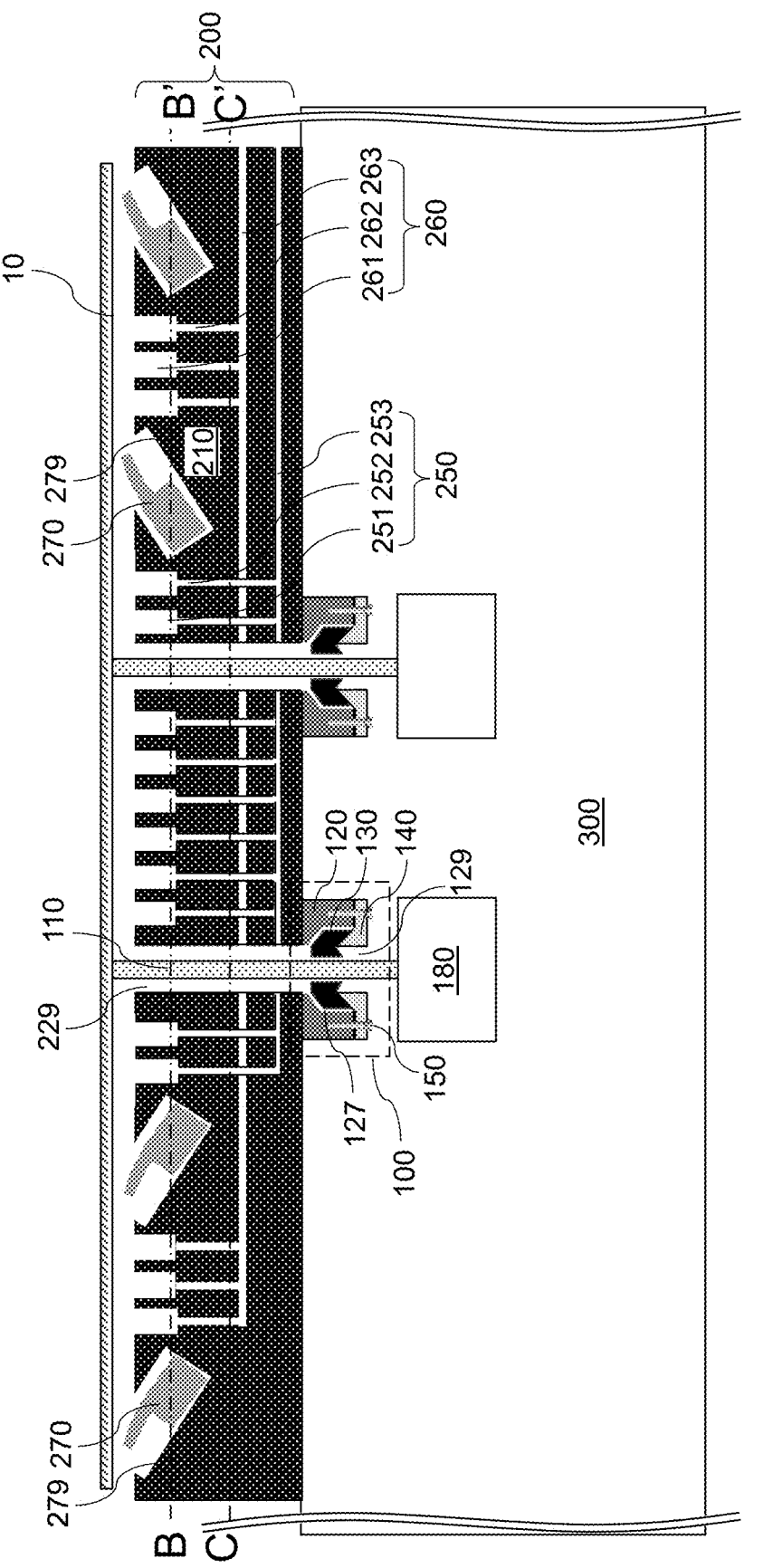
FIG. 2A is a vertical cross-sectional view a wafer chuck after loading a wafer on the wafer chuck and before lowering lift pins according to an embodiment of the present disclosure.
Figure 2B:
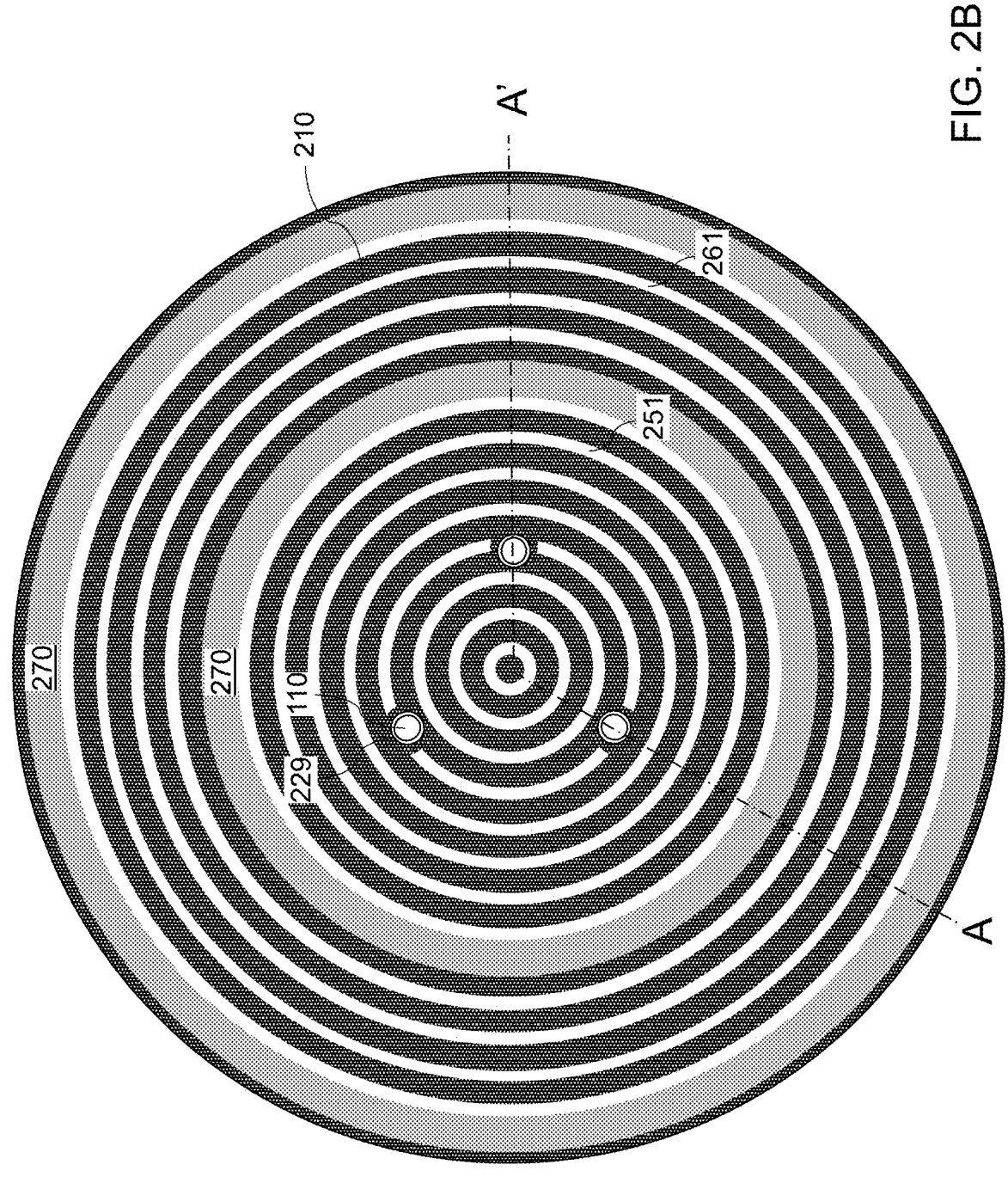
FIG. 2B is a horizontal cross-sectional view of the wafer chuck along the horizontal plane B-B' of FIG. 2A. The hinged vertical plane A-A' is the cut plane of the vertical cross-sectional view of FIG. 2A.
Figure 2C:
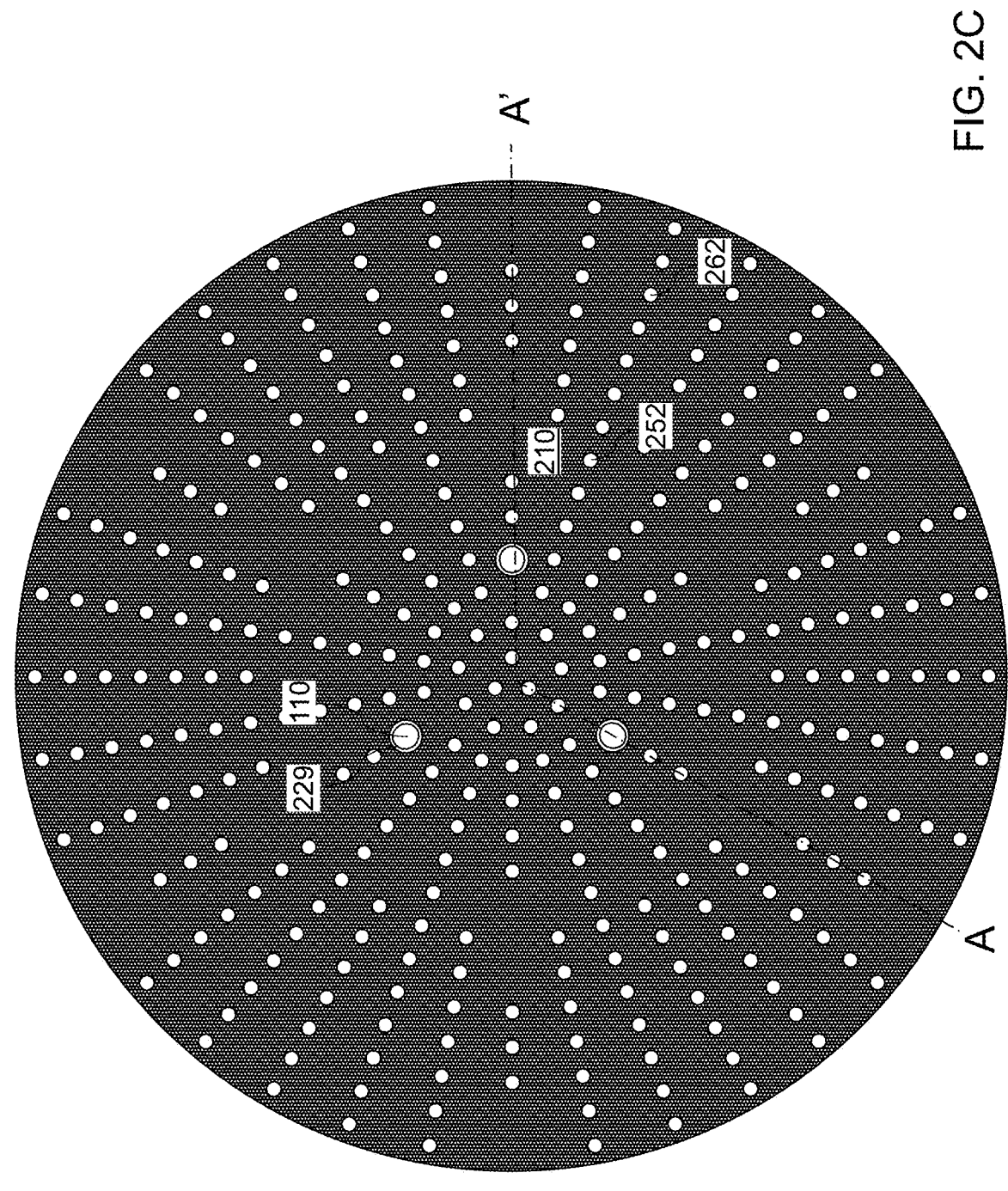
FIG. 2C is a horizontal cross-sectional view of the wafer chuck along the horizontal plane C-C' of FIG. 2A. The hinged vertical plane A-A' is the cut plane of the vertical cross-sectional view of FIG. 2A.

Referring to FIGS. 2A-2C, the combination of the wafer chuck 200 and the wafer stage 300 is shown at a processing step at which the wafer 10 is loaded over the wafer chuck 200, and is supported by a set of lift pin 110 prior to placement of the wafer 10 on the top surface of the wafer chuck 200. Typically, the wafer 10 may be laterally transported to an area overlying the top surface of the wafer chuck 200 while being supported underneath by a blade of a robotic arm (not illustrated) while the set of lift pins 110 is retracted. The area of the blade of the robotic arm does not overlap with the area of the set of lift pins 110. The set of lift pins is raised to lift the wafer 10 above the blade of the robotic arm. The blade of the robotic arm may be subsequently retracted to a position that does not have an areal overlap with the wafer chuck 200. At this step, the wafer 10 is supported by the set of lift pins 110. Typically, three lift pins 110 are used to support the wafer 10 for reasons of mechanical stability, although four or more lift pins 110 may also be used.

The wafer chuck 200 comprises a chuck body 210, which is a matrix of the wafer chuck 200 having various structural features therein. A plurality of lift-pin holes 229 vertically extends through the chuck body 210 of the wafer chuck 200. A plurality of lift pins 110 may be located in the plurality of lift-pin holes 229. According to an aspect of various embodiments, a plurality of vacuum seal assemblies 100 may laterally surround a bottom portion of a respective one of the plurality of lift pins 110. In other words, each of the lift pins 110 comprises an upper portion that is located within a lift-pin hole 229 and is laterally surrounded by the wafer chuck 200, and a bottom portion that is laterally surrounded by a vacuum seal assembly 100. The bottom end of each of the lift pins 110 may be connected to a lift pin actuation mechanism 180 that is configured to provide vertical movement to a respective lift pin 110. The lateral dimension, such as the diameter, of each lift-pin hole 229 may be in a range from 10 microns to 40 microns, although lesser and greater lateral dimensions may also be used.

According to an aspect of various embodiments, each vacuum seal assembly 100 within the plurality of vacuum seal assemblies 100 comprises a respective set of ring segments 130 that are configured to be assembled into a respective contiguous structure under a condition of an upward gas flow within a respective lift-pin hole 229 selected from the plurality of lift-pin holes 229. As used herein, a "contiguous structure" refers to a set of mechanical components in which each pair of a first mechanical component and a second mechanical component selected within the set is connected to each other through direct contact with each other, or through a set of direct contacts with mechanical components that are selected as a subset of the set of mechanical components. The mechanism for assembly into the respective contiguous structure is subsequently described with reference to a step at which such assembly occurs.

In one embodiment, each vacuum seal assembly 100 within the plurality of vacuum seal assemblies 100 comprises: a respective confinement matrix structure (120, 140) including a respective vertically-extending opening 129 that is aligned to a respective overlying lift-pin hole 229 selected from the plurality of lift-pin holes 229 and a respective annular cavity 127 connected to, and laterally surrounding, the respective vertically-extending opening 129; and a respective set of ring segments 130 located in the respective annular cavity 127 and configured to form a contiguous structure in a respective sealing state and configured to form multiple disjoined structures in a respective non-sealing state. At the processing step illustrated in FIGS. 2A-2C, each set of ring segments 130 is in a respective non-sealing state, and is not in direct contact with any of the lift pins 110.

As used herein, "disjoined structures" refer to a set of multiple mechanical component that do not have any direct contact thereamongst. In one embodiment, a confinement matrix structure (120, 140) may comprise, a contoured cap structure 120 including a first annular sloping sliding surface that tapers downward with a lateral distance from a vertically-extending opening 129, and a contoured base structure 140 including a second annular sloping sliding surface that tapers downward with the lateral distance from the vertically-extending opening 129. The contoured base structure 140 can be affixed to the contoured cap structure 120 by at least one fastening element 150, which may comprise screws, nuts, bolts, rivets, clips, pins, etc.

The wafer chuck 200 is configured to hold a wafer 10 on a top surface thereof. In one embodiment, the top surface of the wafer chuck 200 includes at least one vacuum manifold (250, 260). In one embodiment, the at least one vacuum manifold (250, 260) may comprise a plurality of vacuum grooves (251, 261) comprising cavities in recessed regions of the top surface of the wafer chuck 200, and vacuum pumping manifolds (252, 262, 253, 263) which are embedded in the wafer chuck 200 and connected to the plurality of vacuum grooves (251, 261). The at least one vacuum manifold (250, 260) may comprise an inner vacuum manifold 250 and an outer vacuum manifold 260.

In an illustrative example, the plurality of vacuum grooves (251, 261) may comprise inner vacuum grooves 251 located in a central area of the wafer chuck 200, and outer vacuum grooves 261 that are located in an outer area (i.e., a peripheral area) of the wafer chuck 200. In this embodiment, the wafer chuck 200 may be configured to process wafers 10 of different sizes. For example, only the inner vacuum grooves 251 may be used to hold a wafer 10 of a smaller size (such as a 200 mm wafer), and a combination of the inner vacuum grooves 251 and the outer vacuum grooves 261 may be used to hold a wafer 10 of a larger size (such as a 300 mm wafer). All, or a fraction, of the plurality of vacuum grooves (251, 261) may be arranged as concentric toroidal cavities.

The vacuum pumping manifolds (252, 262, 253, 263) may comprise inner vertically-extending pumping manifolds 252 connected to the inner vacuum grooves 251, outer vertically-extending pumping manifolds connected to the outer vacuum grooves 262, inner laterally-extending pumping manifolds 253 connected to the inner vertically-extending pumping manifolds 252 and connected to a first vacuum pump (not shown) through a first pumping line (not shown), and outer laterally-extending pumping manifolds 263 connected to the outer vertically-extending pumping manifolds 263 and connected to a second vacuum pump (not shown) through a second pumping line (not shown).

The top surface of the wafer chuck 200 may comprise at least annular one lip seal cavity 279 in which a respective lip seal 270 is positioned. Each lip seal 270 may also be referred to as a ring seal, an o-ring seal, or a radial seal, and comprises a deformative material such as a polymer material. Each lip seal 270 may be configured to provide a vacuum seal along the radial direction. Specifically, each lip seal 270 is configured to contact an annular surface segment of the bottom surface of the wafer 10, and prevent leakage of gas (which may be filtered air having a low density of particles) from outside to inside while vacuum suction is applied to the at least one vacuum manifold (250, 260). Under an ideal situation, the vacuum seal(s) provided by the lip seal(s) 270 is/are tight, and teach of the at least one vacuum manifold (250, 260) can maintain a pressure that is low enough (e.g., below 10 mTorr and/or below 1 mTorr) that does not overload the pump(s) that provide vacuum suction to the at least one vacuum manifold (250, 260). The vacuum seal may secure the wafer 10 to the wafer chuck 200.

Figure 2D:
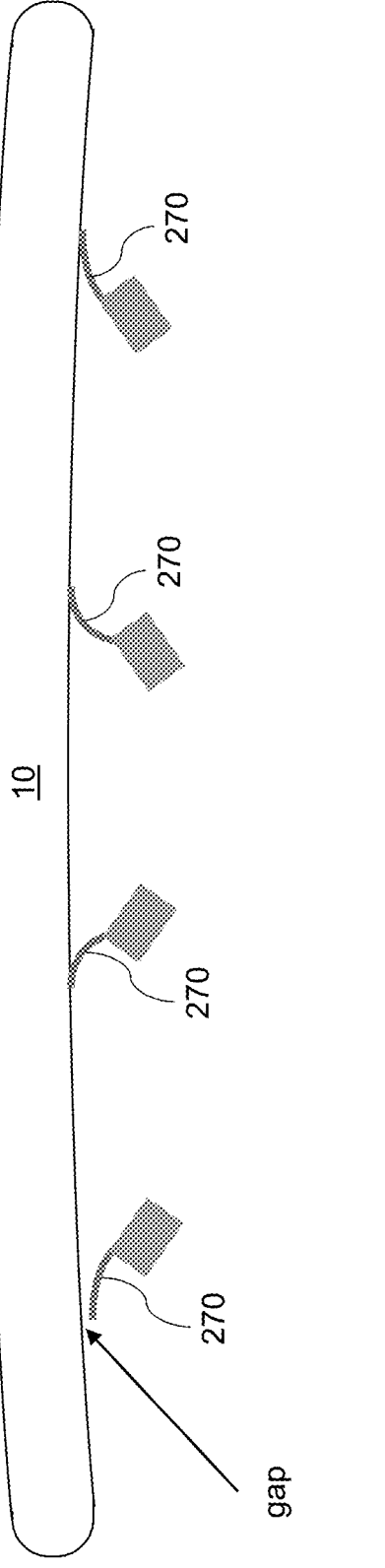
FIG. 2D is a schematic vertical cross-sectional view of a gap between a wafer and lip seals in case of a severe wafer warpage.

As the complexity of semiconductor devices and/or embedded or stacked semiconductor dies and/or redistribution structures in the wafer 10 increases, the warpage of the wafer 10 generally increases due to the mechanical stress within the wafer 10. Severe warpage of the wafer 10 may cause the formation of a gap of sufficient height between the bottom surface of the wafer 10 and the at least one lip seal 270. FIG. 2D schematically illustrates a gap between a wafer 10 and lip seals in case of a severe wafer warpage caused by such mechanical stress in the wafer 10. While FIG. 2D illustrates a configuration in which the bottom surface of the wafer 10 has a concave vertical cross-sectional profile, the warpage of the wafer may be manifested in a manner that causes convex and/or concave vertical cross-sectional profiles for the bottom surface of the wafer 10. Further, the warpage of the wafer 10 may be azimuthally dependent depending on the structures incorporated into the wafer 10.

According to an aspect of the present disclosure, each of the plurality of vacuum seal assemblies 100 is configured to provide a conditional vacuum seal that activates if a vacuum seal at a lip seal 270 fails, and an air flow that is sufficient to disrupt the vacuum suction is present within a vertically-extending opening 129 in a respective vacuum seal assembly 100.

As discussed above, the wafer chuck 200 is configured to move along horizontal directions. The plurality of vacuum seal assemblies 100 is attached to a bottom surface of the wafer chuck 200, and is configured to move with the wafer chuck 200 during movement of the wafer 10 along the first horizontal direction hd1 and along the second horizontal direction hd2.

Figure 3:
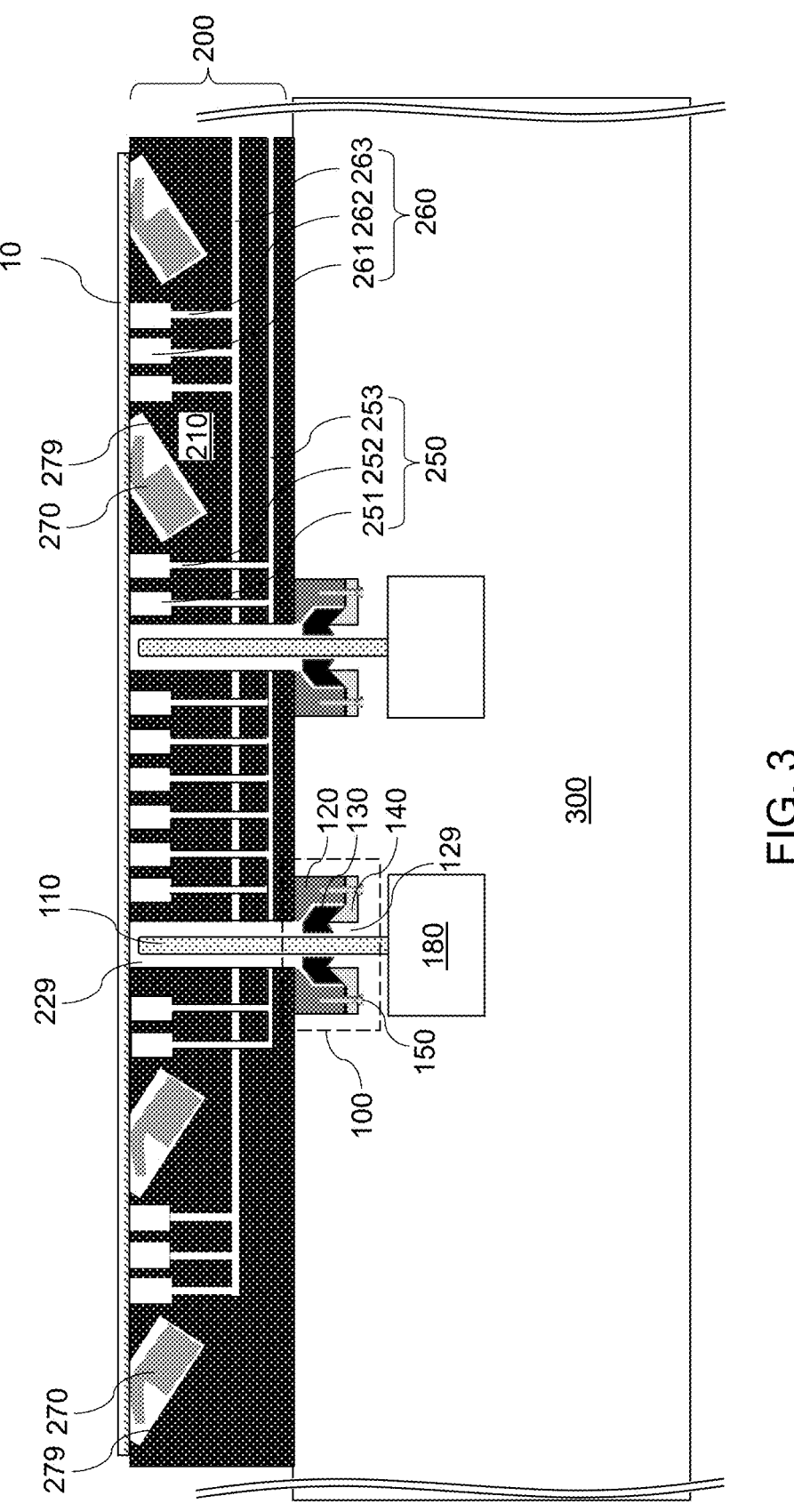
FIG. 3 is a vertical cross-sectional view of a wafer chuck after lowing the lift pins in embodiments in which no gap is present between the wafer and the wafer chuck after applying vacuum suction according to an embodiment of the present disclosure.

Referring to FIG. 3, the combination of the wafer chuck 200 and the wafer stage 300 is shown at a subsequent processing step, at which the lift pins 110 are retracted, and vacuum suction is activated in the at least one vacuum manifold (250, 260). In the embodiment illustrated in FIG. 3, the wafer 10 may be flat enough, i.e., the warpage of the wafer 10 is small enough, to provide a vacuum seal at each of the lip seals 270. For example, as shown in FIG. 3, no gap is present between the wafer 10 and the wafer chuck 200 due to continuous contact between the at least one lip seal 270 and the bottom surface of the wafer 10 after application of the vacuum suction to the at least one vacuum manifold (250, 260). In this embodiment, the vacuum seal assemblies 100 are not activated, and each set of ring segments 130 remain on the second annular sloping sliding surface of the contoured base structure 140 due to gravity as a set of disjoined components that do not contact one another.

Figure 4:
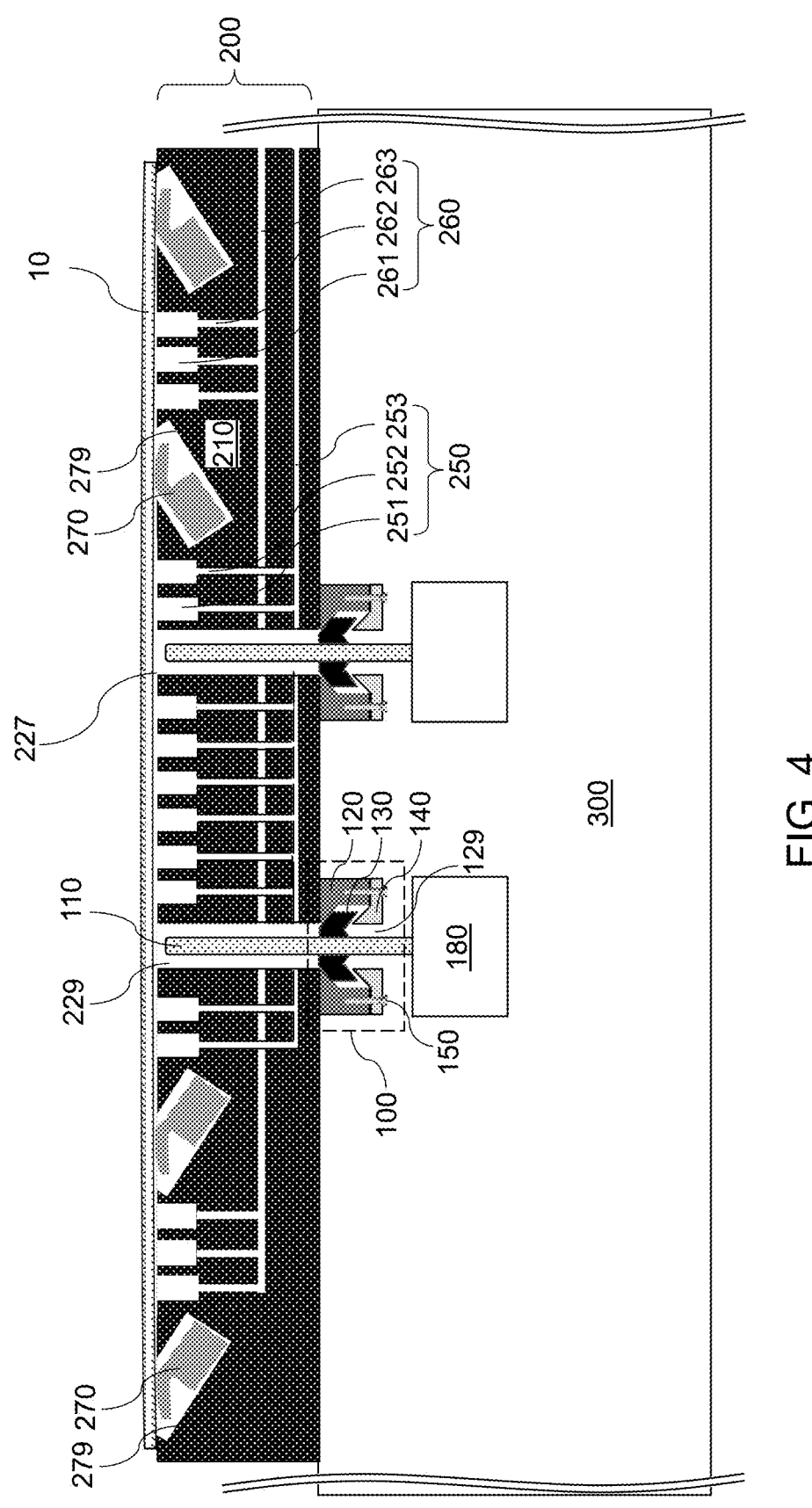
FIG. 4 is a vertical cross-sectional view of the wafer chuck after lowering the lift pins in embodiments in which a gap is present between the wafer and the wafer chuck after applying vacuum suction according to an embodiment of the present disclosure.

Referring to FIG. 4, the combination of the wafer chuck 200 and the wafer stage 300 is shown at the processing step, at which the lift pins 110 are retracted, and vacuum suction is activated in the at least one vacuum manifold (250, 260). In the embodiment illustrated in FIG. 4, the wafer 10 may be warped to cause of failure of a vacuum seal at one of the lip seals 270. For example, a gap is present between the wafer 10 and the wafer chuck 200, and a discontinuity in the contact between the at least one lip seal 270 and the bottom surface of the wafer 10 is present after application of the vacuum suction to the at least one vacuum manifold (250, 260). In this embodiment, at least one of the plurality of vacuum seal assemblies 100 is activated, and a respective set of ring segments 130 move upward and inward along the first second annular sloping sliding surface of the contoured cap structure 140 to form a contiguous structure.

Generally, each vacuum seal assembly 100 within the plurality of vacuum seal assemblies 100 comprises a respective set of ring segments 130 that are configured to be assembled into a respective contiguous structure under a condition of an upward gas flow within a respective lift-pin hole 229 selected from the plurality of lift-pin holes 229. The wafer 10 may be pulled toward the top surface of the wafer chuck 200 by providing a vacuum suction on a backside of the wafer 10, and a vacuum seal may be formed in one, and/or each, of the plurality of vacuum seal assemblies 100 by assembling a respective set of ring segments 130 selected from the sets of ring segments 130 into a respective contiguous structure that laterally surrounds, and contacts, a respective lift pin 110 selected from the plurality of lift pins 110.

In one embodiment, the set of ring segments 130 is not in direct contact with one another, and is not in direct contact with the respective lift pin 110 prior to providing the vacuum suction on the backside of the wafer 10. However, a failure in formation of a vacuum seal between a lip seal 270 and the bottom surface of the wafer 10 causes gas flow through the gap. The inside of the wafer stage 300 is generally maintained at an ambient pressure, and thus, gas flow is induced through the vertically-extending opening 129 in the plurality of vacuum seal assemblies 100 and the lift-pin holes 229. A vacuum seal may be formed in one, and/or each, of the plurality of vacuum seal assemblies 100 by assembling a respective set of ring segments 130 into a respective contiguous structure under a condition of an upward gas flow within a respective lift-pin hole 229 selected from the plurality of lift-pin holes 229. In this embodiment, the set of ring segments 130 is assembled into the continuous structure by transfer of upward momentum to the set of ring segments 130 during the upward gas flow within a respective lift-pin hole 229.

Figures 5A, 5B, 6A, 6B:
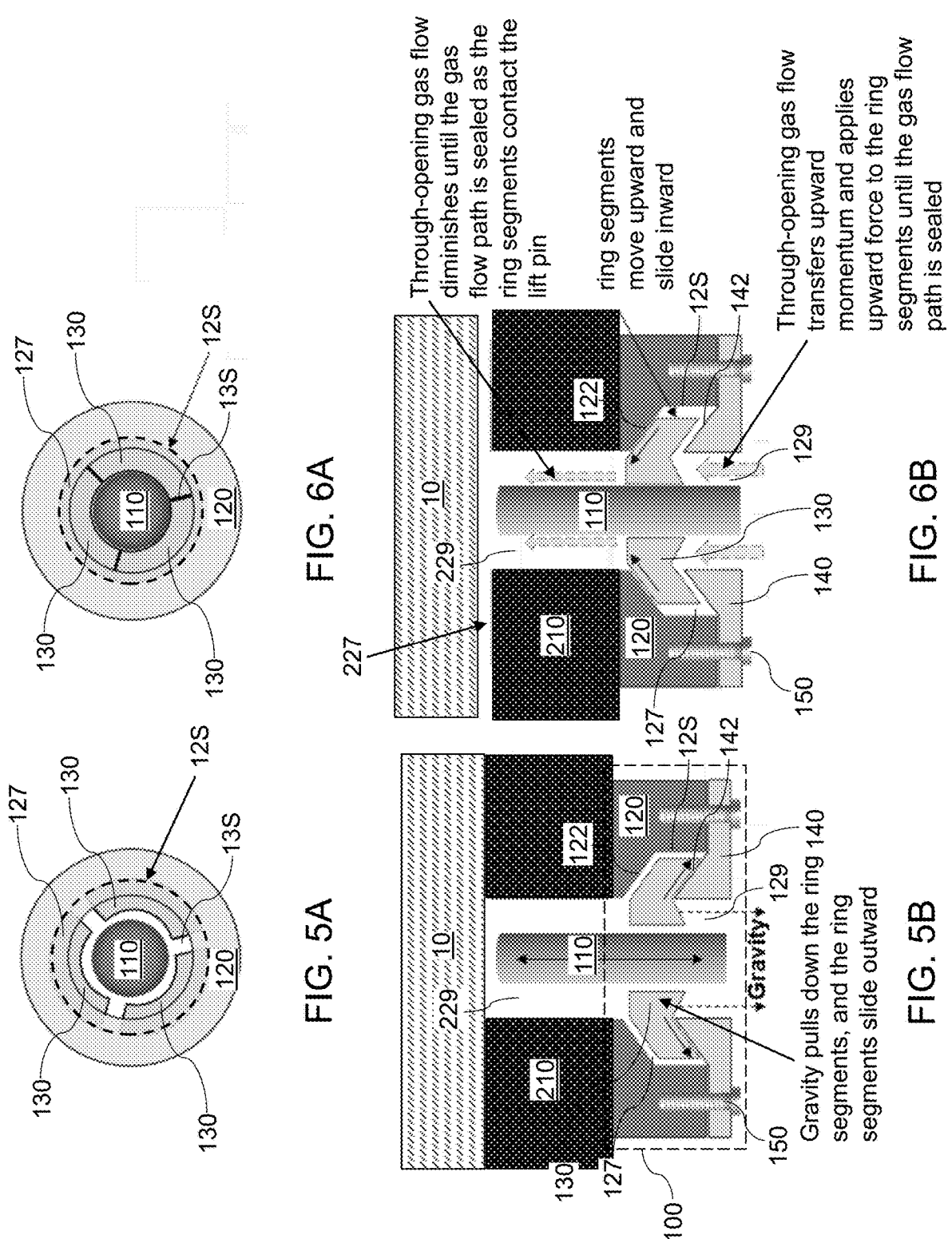
FIG. 5A is a top-down view of a vacuum seal assembly in which ring segments are disjoined from one another according to an aspect of the present disclosure.
FIG. 5B is a vertical cross-sectional view of the vacuum seal assembly of FIG. 5A.
FIG. 6A is a top-down view of a vacuum seal assembly in which ring segments are adjoined to one another to form a contiguous structure according to an aspect of the present disclosure.
FIG. 6B is a vertical cross-sectional view of the vacuum seal assembly of FIG. 6A.

Referring to FIGS. 5A and 5B, a vacuum seal assembly 100 is illustrated in a configuration in which the ring segments 130 are disjoined from one another. FIG. 5A and a top-down view, and FIG. 5B is a vertical cross-sectional view. FIGS. 5A and 5B correspond to the configuration illustrated in FIG. 3.

As discussed above, each vacuum seal assembly 100 within the plurality of vacuum seal assemblies 100 may comprise a respective confinement matrix structure (120, 140) including a respective vertically-extending opening 129 that is aligned to a respective overlying lift-pin hole 229 selected from the plurality of lift-pin holes 229 and a respective annular cavity 127 connected to, and laterally surrounding, the respective vertically-extending opening 129, and a respective set of ring segments 130 located in the respective annular cavity 127 and configured to form a contiguous structure in a respective sealing state and configured to form multiple disjoined structures in a respective non-sealing state. The respective confinement matrix structure (120, 140) comprises a respective contoured cap structure 120 including a first annular sloping sliding surface 122 that tapers downward with a lateral distance from the respective vertically-extending opening 129, and a respective contoured base structure 140 including an annular sloping top surface 142 that tapers downward with the lateral distance from the respective vertically-extending opening 129. A cylindrical sidewall 12S of the respective contoured cap structure 120 can connect an outer periphery of the first annular sloping sliding surface 122 to an outer periphery of the first annular sloping sliding surface 122. At least one fastening element 150 can be used to affix the respective contoured base structure 140 to the respective contoured top structure 120.

In one embodiment, each annular cavity 127 is vertically bounded at top by a respective first annular sloping sliding surface 122 that is configured to guide an inward-and-upward sliding movement of each ring segment 130 therein during a transition into the respective sealing state, and each annular cavity 127 is vertically bounded at bottom by a respective second annular sloping sliding surface 142 that is configured to guide an outward-and-downward sliding movement of each ring segment 130 therein during a transition to the respective non-sealing state. Each set of ring segments 130 is configured to contact the first annular sloping sliding surface 122 and not to contact the second annular sloping sliding surface 142 in the respective sealing state, and is configured to contact the second annular sloping sliding surface 142 and not to contact the first annular sloping sliding surface 122 in the respective non-sealing state.

The configuration illustrated in FIGS. 5A and 5B corresponds to the non-sealing state. The plurality of lift pins 110 vertically extends through the vertically-extending openings 129 of the confinement matrix structures (120, 140). Each of the set of ring segments 130 is not in direct contact with the respective lift pin 110 in the respective non-sealing state. In one embodiment, each set of ring segments 130 is configured to separate from one another to provide multiple disjoined structures under a condition of equal pressure between a volume inside a respective lift-pin hole 229 and a volume underlying the set of ring segments 130, i.e., the volume of a lower portion of a vertically-extending opening 129 through a vacuum seal assembly 100. Under the condition of equal pressure between a volume inside a lift-pin hole 229 and a lower portion of a vertically-extending opening 129 (e.g., a base opening through a contoured base structure 140), the only force applied to the set of ring segments 130 can be gravity, which pulls down the ring segments 130 and causes the ring segments 130 slide outward and downward and to separate from one another to form a set of disjoined structures.

In one embodiment, each contoured base structure 140 has a respective base opening. Each lift pin 110 vertically extends through the respective base opening. Each set of ring segments 130 overlies more than 50%, such as a percentage in a range from 50% to 80%, of a total area of the respective base opening that is not occupied by the respective lift pin 110 while the set of ring segments 130 is in a non-sealing state.

Each vacuum seal assembly 100 can remain in the configuration illustrated in FIGS. 5A and 5B until the wafer 10 is processed in the semiconductor processing apparatus (such as the semiconductor processing apparatus illustrated in FIG. 1).

Referring to FIGS. 6A and 6B, a vacuum seal assembly 100 is illustrated in a configuration in which the ring segments 130 are disjoined from one another. FIG. 6A and a top-down view, and FIG. 6B is a vertical cross-sectional view. FIGS. 6A and 6B correspond to the configuration illustrated in FIG. 4.

As discussed above, at the processing step described with reference to FIG. 4, the wafer 10 can be pulled toward the top surface of the wafer chuck 200 by providing a vacuum suction on a backside of the wafer 10. A breach in a vacuum seal may occur at one of the lip seals 270, and a gas flow may be induced at a gap 227 between the wafer 10 and the top surface of the chuck body 210 and include an upward gas flow through each vertically-extending opening 129 of at least one vacuum seal assembly 100 (which may be a plurality of vacuum seal assemblies 100). A vacuum seal can be formed in one, and/or each, of the plurality of vacuum seal assemblies 100 by inducing at least one set of ring segments 130 within the plurality of vacuum seal assemblies 100 to contact, and laterally surround, a respective one of the plurality of lift pins 110.

In one embodiment, each annular cavity 127 is vertically bounded at top by a first annular sloping sliding surface 122 of a confinement matrix structure (120, 140) of a respective vacuum seal assembly 100. Each set of ring segments 130 is induced to contact, and laterally surround, a respective one of the plurality of lift pins 110 by momentum transfer by a gas flow upward around the one of the plurality of lift pins 110.

In one embodiment, the bottom surface of each of the ring segments 130 may have a tapered inner surface which tapers upward with a lateral distance outward from a vertical axis passing through the geometrical center of a respective vertically-extending opening 129. Upward air flow within the base opening through the contoured base structure 140 is deflected upward and outward to lift the ring segments 130 off the second annular sloping sliding surface 142 of the confinement matrix structure (120, 140). A through-opening gas flow transfers upward momentum to the ring segments 130, and applied an upward force to the ring segments 130 until the gas flow path is sealed. The ring segments 130 are lifted upward due to the pressure applied to the bottom surfaces of the ring segments 130. In one embodiment, each ring segment 130 within the set of ring segments 130 slides inward and upward along the first annular sloping sliding surface 122. The through-opening gas flow through a gap between the lift pin 110 and the set of ring segments 130 diminishes as the gap between lift pin 110 and the set of ring segments 130 shrinks. The through-opening gas flow diminishes until the gas flow path is sealed as the ring segments 130 contact the lift pin 110.

Each ring segment 130 presses against a lift pin 110 and against one another while being pushed inward and upward by the momentum transfer of the air flow through the vertically-extending opening 129 through the contoured base structure 140, thereby providing a vacuum seal against the lift pin 110 by forming a contiguous structure that forms a gapless contact with the lift pin 110. Generally, each set of ring segments 130 may be configured to move upward and to move inward during assembly into the respective contiguous structure. The ring segments 130 may comprise a deformative material that can deform under pressure and to form a tight sealing contact against one another and against a respective lift pin 110.

In one embodiment, each of the set of ring segments 130 is in direct contact with a respective segment of a cylindrical sidewall of a respective lift pin 110 in a sealing state. Each set of ring segments 130 is configured to contact the first annular sloping sliding surface 122 and not to contact the second annular sloping sliding surface 142 in the sealing state. In one embodiment, each set of ring segments 130 moves upward and inward toward a respective lift pin 110 during assembly into the respective contiguous structure.

Formation of at least one vacuum seal in the vacuum seal assemblies 100 can stop the gas flow through the gap 227 between the wafer 10 and the wafer chuck 200, and can provide vacuum suction to the backside of the wafer 10 despite a vacuum seal failure between a lip seal 270 and the backside the wafer 10. Generally, each set of ring segments 130 is configured to remain as a respective contiguous structure under a condition of a full or partial vacuum within a respective lift-pin hole 229. For example, the pressure differential between the volume of a lift-pin hole 229 and an underlying vertically-extending opening 129 may cause each set of ring segments 130 assembled as a contiguous structure to apply an upward force to the first annular sloping sliding surface 122 and to maintain the vacuum seal as long as the at least one vacuum manifold (250, 260) is under vacuum.

The wafer 10 may be subsequently processed in the semiconductor processing apparatus 1000 for an intended processing step, which may comprise a lithographic processing step, an etch step, or a deposition step. In an illustrative example, in embodiments in which the semiconductor processing apparatus 1000 comprises a lithographic processing stool, a lithographic exposure process may be performed on a photoresist layer on the wafer 10. In one embodiment, the semiconductor processing apparatus 1000 comprises a wafer stage 300 configured to provide a two-dimensional lateral movement of the wafer chuck 200 along a first horizontal direction hd1 and along a second horizontal direction hd2, and the wafer chuck 200 may be horizontally moved after the wafer 10 is pulled toward the top surface of the wafer chuck 200, for example, to move between different exposure fields during a lithographic exposure process. In one embodiment, the semiconductor processing apparatus 1000 comprises a lithographic exposure apparatus that comprises: a laser system 600 configured to generate a laser beam; an illumination optics system 700 comprising a reticle 710 therein and configured to guide the laser beam through the reticle 710; and a projection optics system 800 located between the illumination optics system 700 and the wafer chuck 200 and configured to focus the laser beam onto a respective exposure field on the wafer 10 as illustrated in FIG. 1. In this embodiment, a photoresist layer on a top surface of the wafer 10 can be lithographically exposed after providing the vacuum suction on the backside of the wafer 10 and while the vacuum suction is maintained.

Once the processing step is performed on the wafer 10, the vacuum suction on the backside of the wafer 10 may be deactivated. Each contiguous structure including an assembly of a set of ring segments 130 may be transformed into a set of non-contacting discrete structures in which the set of ring segments 130 is not in direct contact with one another and does not contact a respective lift pin 110, i.e., to provide a configuration illustrated in FIGS. 5A and 5B. Each set of ring segments 130 which remained as a contiguous structure during the processing step may be separated from one another to provide multiple disjoined structures under a condition of equal pressure between the volume inside the respective lift-pin hole 229 and a volume underlying the set of ring segments 130, i.e., the volume of a base opening through the contoured base structure 140.

In one embodiment, each assembled set of ring segments 130 may move downward and outward during a transition from the respective contiguous structure to the multiple disjoined structures. In one embodiment, each annular cavity 127 is vertically bounded at bottom by a second annular sloping sliding surface 142 of a respective confinement matrix structure (120, 140). Each assembled set of ring segments 130 can be induced to slide outward and downward along the second annular sloping sliding surface 142 after processing the wafer 10, for example, by turning off the vacuum suction to the at least one vacuum manifold (250, 260).

Referring collectively to FIGS. 5A, 5B, 6A, and 6B, each vacuum seal assembly 100 within the plurality of vacuum seal assemblies 100 comprises a respective set of ring segments 130 configured to be assembled into a respective contiguous structure providing a vacuum seal against a respective lift pin 110 hole under a condition of a positive pressure differential between a volume underlying the vacuum seal assembly 100 and a respective lift-pin hole 229 selected from the plurality of lift-pin holes 229. As discussed above, each vacuum seal assembly 100 within the plurality of vacuum seal assemblies 100 comprises a respective confinement matrix structure (120, 140) including a respective vertically-extending opening 129 that is aligned to a respective overlying lift-pin hole 229 selected from the plurality of lift-pin holes 229 and a respective annular cavity 127 connected to, and laterally surrounding, the respective vertically-extending opening 129. Each set of ring segments 130 is located partly within a volume of the respective annular cavity 127.

In one embodiment, each set of ring segments 130 is located partly within a volume of the respective vertically-extending opening 129; and a volume fraction of the respective set of ring segments 130 located within the volume of the respective vertically-extending opening 129 is greater during formation of the respective contiguous structure in a sealing state than in a non-sealing state in which the respective set of ring segments 130 is not in contact with one another.

In one embodiment, each confinement matrix structure (120, 140) comprises a respective contoured cap structure 120 including an first annular sloping sliding surface 122 that tapers downward with a lateral distance from the respective vertically-extending opening 129, and a respective contoured base structure 140 including an annular sloping top surface 142 that tapers downward with the lateral distance from the respective vertically-extending opening 129.

Figures 7A, 7B:
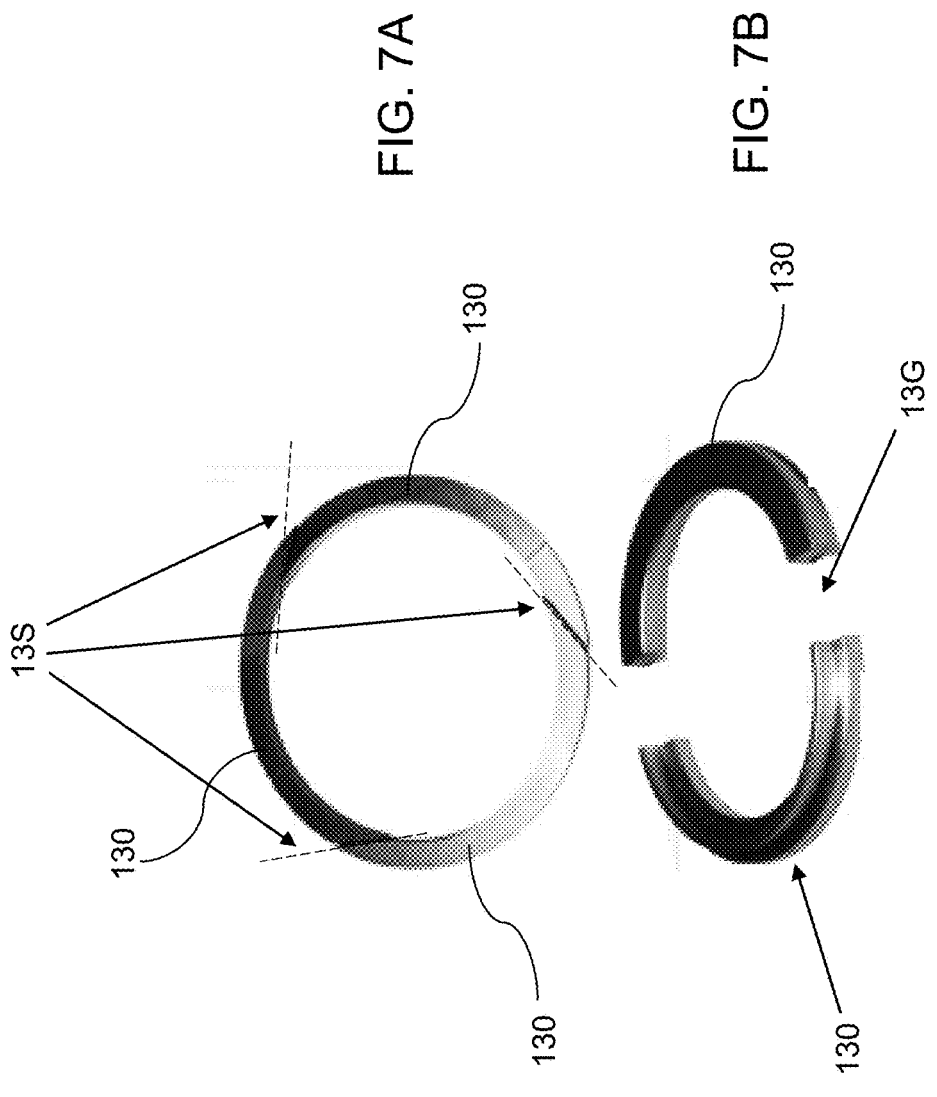
FIG. 7A is a perspective view of a first exemplary set of ring segments according to an embodiment of the present disclosure.
FIG. 7B is a perspective view of a second exemplary set of ring segments according to an embodiment of the present disclosure.

Generally, the number of ring segments 130 that assemble to form a contiguous structure may be any integer greater than 1, such as 2, 3, 4, etc. FIG. 7A is a perspective view of a first exemplary set of ring segments 130 according to an embodiment of the present disclosure. FIG. 7B is a perspective view of a second exemplary set of ring segments 130 according to an embodiment of the present disclosure. FIG. 7A corresponds to a configuration in which three ring segments 130 are assembled to form a contiguous structure, for example, as illustrated in FIGS. 4, 6A, and 6B. In this embodiment, seals 13S are formed between each azimuthally neighboring pair of ring segments 130. FIG. 7B corresponds to a configuration in which two ring segments 130 are separated from each other, for example, as illustrated in FIGS. 3, 5A, and 5B. In this embodiment, gaps 13G are present between the ring segments 130.

Figure 8A:
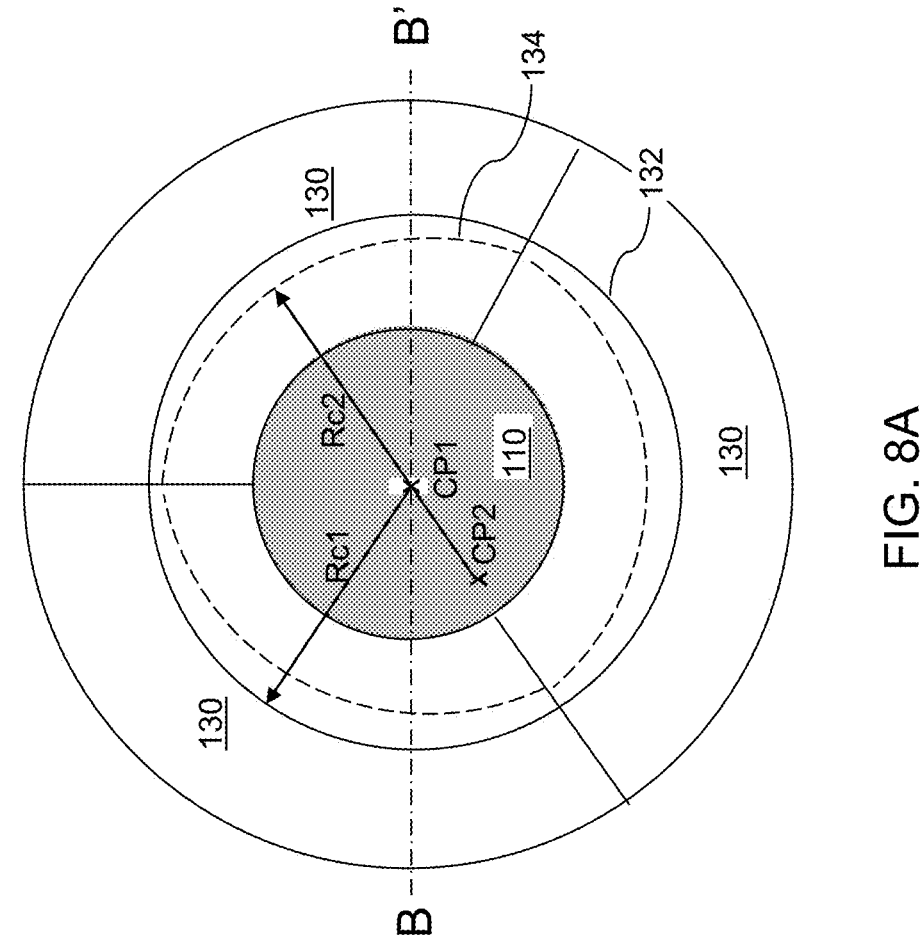
FIG. 8A is a top-down view of a vacuum seal assembly in which ring segments are adjoined to one another to form a contiguous structure according to an aspect of the present disclosure.
Figure 8B:
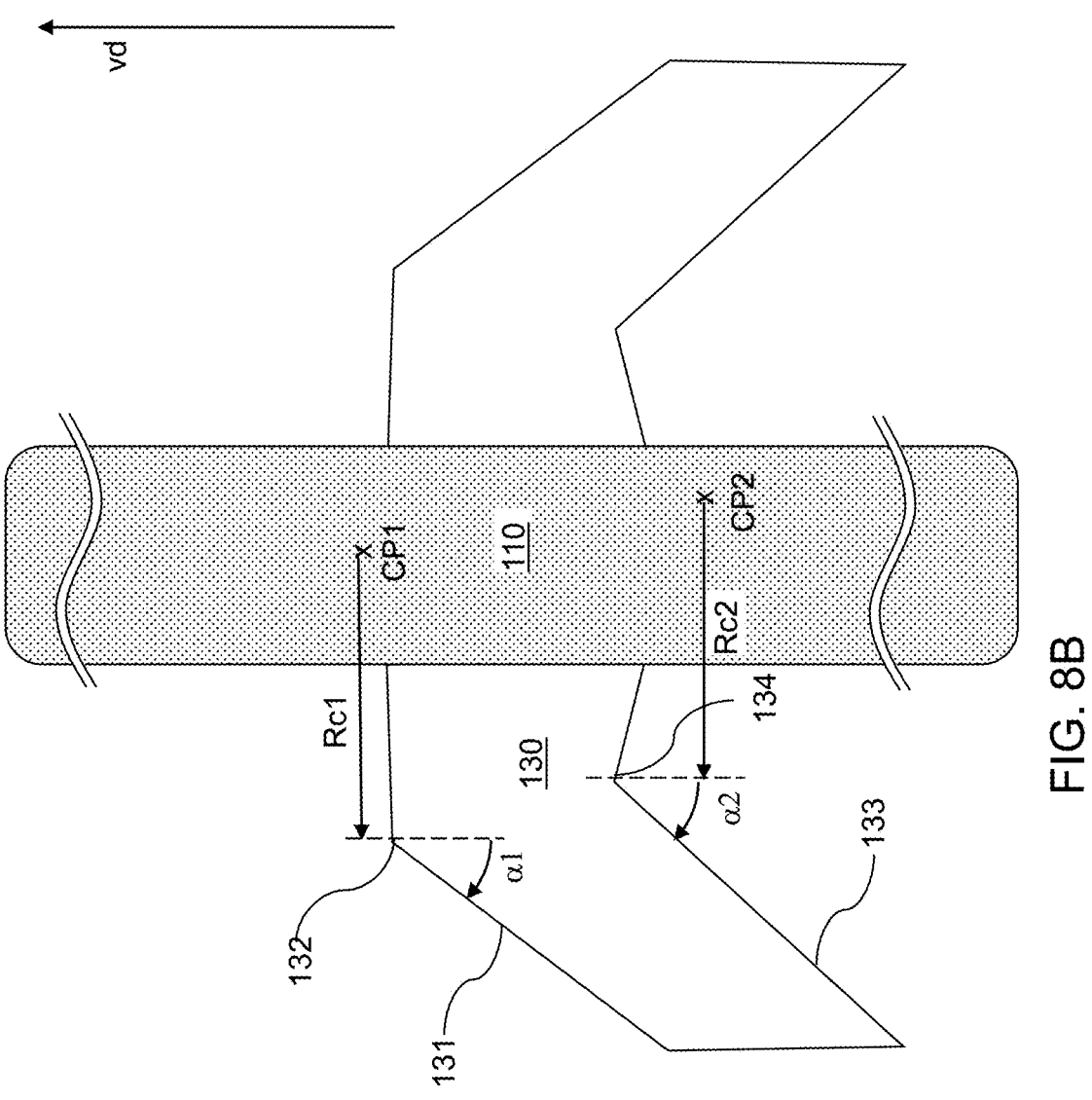
FIG. 8B is a vertical cross-sectional view of a ring segment in the vacuum seal assembly along the vertical plane B-B' of FIG. 8A.

Referring to FIGS. 8A and 8B, a non-limiting exemplary embodiment of a set of ring segments 130 is illustrated. FIG.

8A is a top-down view of a vacuum seal assembly 100 around a lift pin 110 while a set of ring segments 130 is adjoined to one another to form a contiguous structure. FIG. 8B is a vertical cross-sectional view of one of the ring segments 130 in the vacuum seal assembly 100 along the vertical plane B-B' of FIG. 8A.

With reference to FIGS. 5A, 5B, 6A, 6B, 8A, and 8B, in one embodiment, each of the ring segments 130 comprises an upper tapered sliding surface 131 having a first taper angle $\alpha 1$ within respect to a vertical direction vd in a range from 15 degrees to 60 degrees and having a first upper edge 132 that has a first radius of curvature Rc1 around a respective first center point CP1 that is a center of an arc that coincides with the first upper edge 132. The upper tapered sliding surface 131 slides upward and inward along the first annular sloping sliding surface 122 of an contoured cap structure 120 during assembly of a set of ring segments 130 into a contiguous structure. Upon assembly of the set of ring segments 130 into the contiguous structure, the first center points CP1 of each of the ring segments 130 may coincide with one another. Each ring segment 130 may have a respective inner cylindrical sidewall that contacts a lift pin 110 upon assembly into the contiguous structure.

In one embodiment, each of the ring segments comprises a lower tapered sliding surface 133 having a second taper angle $\alpha 2$ with respect to the vertical direction vd in a range from 15 degrees to 60 degrees and having a second upper edge 134 that has a second radius of curvature Rc2 around a respective second center point CP2. The lower tapered sliding surface 133 slides downward and outward along the second annular sloping sliding surface 142 of an contoured base structure 140 during disassembly of a set of ring segments 130 into disjoined discrete components that do not contact one another and do not contact a lift pin 110. Upon disassembly of the set of ring segments 130 into the disjoined components, the second center points CP2 of each of the ring segments 130 may coincide with one another.

In one embodiment, the first upper edge 132 extends by a first azimuthal angle of $2\lambda/n$ around the first center point CP1 and the second upper edge 134 extends by a second azimuthal angle less than $2\lambda/n$ around the second center point CP2, n being an integer greater than 1 such as 2, 3, 4, etc. Lateral extents of each ring segment 130 may be the same or about the same between a pair of radial sidewalls (i.e., sidewalls that extend radially along a fixed azimuthal angle) for each of the ring segments 130. The radial sidewalls may be located within vertical plane that intersect at a respective first center point CP1. The second radius of curvature Rc2 is greater than the first radius of curvature Rc1 by the lateral movement distance of each ring segment 130 during assembly into, or disassembly out of, a respective contiguous structure. The difference between the second radius of curvature Rc2 and the first radius of curvature Rc1 may be in a range from 0.5 mm to 2 mm, although lesser and greater dimensions may also be used.

FIG. 9 is a first flow chart illustrating a set of processing steps for implementing the methods of an embodiment of the present disclosure. In the method illustrated in the first flow chart, a vacuum seal may be formed in one of a plurality of vacuum seal assemblies 100 by assembling a set of ring segments 130 selected from sets of ring segments 130 into a contiguous structure that laterally surrounds, and contacts, a respective lift pin 110 selected from a plurality of lift pins 110.

Referring to step 910 and FIGS. 1, 2, 5A, 5B, 7A, 7B, 8A, and 8B, a semiconductor processing apparatus 1000 may be provided, which comprises a wafer chuck 200 configured to hold a wafer 10 on a top surface thereof. A plurality of lift-pin holes 229 vertically extends through a chuck body 210 of the wafer chuck 200, a plurality of lift pins 110 are located in the plurality of lift-pin holes 229, and a plurality of vacuum seal assemblies 100 each comprising a respective set of ring segments 130 is located around bottom portions of the plurality of lift pins 110.

In one embodiment, the semiconductor processing apparatus 1000 comprises a lithographic exposure apparatus that comprises: a laser system 600 configured to generate a laser beam; an illumination optics system 700 comprising a reticle 710 therein and configured to guide the laser beam through the reticle 710; and a projection optics system 800 located between the illumination optics system 700 and the wafer chuck 200 and configured to focus the laser beam onto a respective exposure field on the wafer 10.

Referring to step 920 and FIGS. 1, 2, 5A, 5B, 7A, 7B, 8A, and 8B, a wafer 10 may be disposed on the top surface of the wafer chuck 200. In one embodiment, the set of ring segments 130 is not in direct contact with one another, and is not in direct contact with the respective lift pin 110 prior to providing the vacuum suction on the backside of the wafer 10.

Referring to step 930 and FIGS. 1, 3, 4, 5A, 5B, 6A, 6B, 7A, 7B, 8A, and 8B, the wafer 10 may be pulled toward the top surface of the wafer chuck 200 by providing a vacuum suction on a backside of the wafer 10.

Referring to step 940 and FIGS. 1, 4, 6A, 6B, 7A, 7B, 8A, and 8B, a vacuum seal may be formed in one, or more, and/or each, of the plurality of vacuum seal assemblies 100 by assembling a set of ring segments 130 selected from the sets of ring segments 130 into a contiguous structure that laterally surrounds, and contacts, a respective lift pin 110 selected from the plurality of lift pins 110. In one embodiment, the set of ring segments 130 is assembled into the continuous structure by transfer of upward momentum to the set of ring segments 130 during an upward gas flow within a respective lift-pin hole 229 selected from the plurality of lift-pin holes 229. The time delay between step 930 and step 940 may be approximately the time it takes for formation of the vacuum seal by an assembly of the set of ring segments 130, and may be in a range from $1.0 \times 10^{-7}$ second to about 3 seconds.

A processing step may be subsequently performed on the wafer 10. In one embodiment, the semiconductor processing apparatus 1000 comprises a lithographic exposure apparatus that comprises: a laser system 600 configured to generate a laser beam; an illumination optics system 700 comprising a reticle 710 therein and configured to guide the laser beam through the reticle 710; and a projection optics system 800 located between the illumination optics system 700 and the wafer chuck 200 and configured to focus the laser beam onto a respective exposure field on the wafer 10. In this embodiment, a photoresist layer on a top surface of the wafer 10 can be lithographically exposed after providing the vacuum suction on the backside of the wafer 10.

The vacuum suction on the backside of the wafer 10 may be deactivated after performing the processing step (e.g., lithographic process) on the wafer 10. To deactivate the vacuum suction, the contiguous structure may be transformed into a set of non-contacting discrete structures in which the set of ring segments 130 is not in direct contact with one another and does not contact the respective lift pin 110.

FIG. 10 is a second flow chart illustrating a set of processing steps for implementing the methods of an embodiment of the present disclosure. In the method illustrated in the second flow chart, a vacuum seal may be formed in one of a plurality of vacuum seal assemblies 100 by assembling a set of ring segments 130 selected from sets of ring segments 130 into a contiguous structure under a condition of an upward gas flow within a respective lift-pin hole 229 selected from the plurality of lift-pin holes 229.

Referring to step 1010 and FIGS. 1, 2, 5A, 5B, 7A, 7B, 8A, and 8B, a semiconductor processing apparatus 1000 can be provided, which comprises a wafer chuck 200 configured to hold a wafer 10 on a top surface thereof. A plurality of lift-pin holes 229 vertically extends through a chuck body 210 of the wafer chuck 200, a plurality of lift pins 110 are located in the plurality of lift-pin holes 229, and a plurality of vacuum seal assemblies 100 laterally surrounds a bottom portion of a respective one of the plurality of lift pins 110.

Referring to step 1020 and FIGS. 1, 2, 5A, 5B, 7A, 7B, 8A, and 8B, a wafer 10 can be disposed on the top surface of the wafer chuck 200.

Referring to step 1030 and FIGS. 1, 3, 4, 5A, 5B, 6A, 6B, 7A, 7B, 8A, and 8B, the wafer 10 can be pulled toward the top surface of the wafer chuck 200 by providing a vacuum suction on a backside of the wafer 10. In one embodiment, the top surface of the wafer chuck 200 includes a plurality of vacuum grooves (251, 261) that is connected to vacuum pumping manifolds (252, 262, 253, 263) which are embedded in the wafer chuck 200; and the plurality of vacuum grooves (251, 261) functions as a conduit for vacuum suction while the wafer 10 is pulled toward the top surface of the wafer chuck 200.

Referring to step 1040 and FIGS. 1, 4, 6A, 6B, 7A, 7B, 8A, and 8B, a vacuum seal may be formed in one, or more, and/or each, of the plurality of vacuum seal assemblies 100 by assembling a set of ring segments 130 selected from the sets of ring segments 130 into a contiguous structure under a condition of an upward gas flow within a respective lift-pin hole 229 selected from the plurality of lift-pin holes 229. In one embodiment, the respective set of ring segments 130 moves upward and inward toward a respective lift pin 110 during assembly into the respective contiguous structure. The time delay between step 1030 and step 1040 may be approximately the time it takes for formation of the vacuum seal by an assembly of the set of ring segments 130, and may be in a range from $1.0 \times 10^{-7}$ second to about 3 seconds.

A processing step may be performed on the wafer while the wafer 10 is attached to the wafer chuck 200 through vacuum suction. The respective set of ring segments 130 may be maintained as the respective contiguous structure under a condition of a full or partial vacuum within the respective lift-pin hole 229 selected from the plurality of lift-pin holes 229. In one embodiment, the semiconductor processing apparatus 1000 comprises a wafer stage 300 configured to provide a two-dimensional lateral movement of the wafer chuck 200 along a first horizontal direction hd1 and along a second horizontal direction hd2. The wafer chuck 200 may be horizontally moved, and can be optionally vertically moved, after the wafer 10 is pulled toward the top surface of the wafer chuck 200 during the processing step.

In one embodiment, the semiconductor processing apparatus 1000 comprises: a laser system 600 configured to generate a laser beam; an illumination optics system 700 comprising a reticle 710 therein and configured to guide the laser beam through the reticle 710; and a projection optics system 800 located between the illumination optics system 700 and the wafer chuck 200 and configured to focus the laser beam onto a respective exposure field on the wafer 10. In this embodiment, a lithographic exposure process can be performed on a photoresist layer on the wafer 10.

In one embodiment, the plurality of vacuum seal assemblies 100 is attached to a bottom surface of the wafer chuck 200; and the plurality of vacuum seal assemblies 100 moves with the wafer chuck 200 during movement of the wafer 10 along the first horizontal direction hd1 and along the second horizontal direction hd2.

In one embodiment, the respective set of ring segments 130 can be separated from one another to provide multiple disjoined structures under a condition of equal pressure between a volume inside the respective lift-pin hole 229 selected from the plurality of lift-pin holes 229 and a volume underlying the set of ring segments 130. In one embodiment, the respective set of ring segments 130 can be moved downward and outward during a transition from the respective contiguous structure to the multiple disjoined structures.

FIG. 11 is a third flow chart illustrating a set of processing steps for implementing the methods of an embodiment of the present disclosure. In the method illustrated in the second flow chart, a vacuum seal may be formed in one of the plurality of vacuum seal assemblies 100 by inducing a set of ring segments 130 within a plurality of vacuum seal assemblies 100 to contact, and laterally surround, one of a plurality of lift pins 110.

Referring to step 1110 and FIGS. 1, 2, 5A, 5B, 7A, 7B, 8A, and 8B, a semiconductor processing apparatus 1000 may be provided, which comprises a wafer chuck 200 configured to hold a wafer 10 on a top surface thereof. A plurality of lift-pin holes 229 vertically extends through a chuck body 210 of the wafer chuck 200, a plurality of lift pins 110 are located in the plurality of lift-pin holes 229, and a plurality of vacuum seal assemblies 100 laterally surrounding a bottom portion of a respective one of the plurality of lift pins 110. A plurality of vacuum seal assemblies 100 each comprising a respective set of ring segments 130 is located around bottom portions of the plurality of lift pins 110.

In one embodiment, each vacuum seal assembly 100 within the plurality of vacuum seal assemblies 100 comprises a respective confinement matrix structure (120, 140) including a respective vertically-extending opening 129 that is aligned to a respective overlying lift-pin hole 229 selected from the plurality of lift-pin holes 229 and a respective annular cavity 127 connected to, and laterally surrounding, the respective vertically-extending opening 129. The set of ring segments 130 is located in an annular cavity 127 of a first vacuum seal assembly 100 selected from the plurality of vacuum seal assemblies 100.

Referring to step 1120 and FIGS. 1, 2, 5A, 5B, 7A, 7B, 8A, and 8B, a wafer 10 may be disposed over the wafer chuck 200 while the plurality of vacuum seal assemblies 100 is not in direct contact with the plurality of lift pins 110.

Referring to step 1130 and FIGS. 1, 3, 4, 5A, 5B, 6A, 6B, 7A, 7B, 8A, and 8B, the wafer 10 may be pulled toward the top surface of the wafer chuck 200 by providing a vacuum suction on a backside of the wafer 10.

Referring to step 1140 and FIGS. 1, 4, 6A, 6B, 7A, 7B, 8A, and 8B, a vacuum seal may be formed in one of the plurality of vacuum seal assemblies 100 by inducing a set of ring segments 130 within the plurality of vacuum seal assemblies 100 to contact, and laterally surround, one of the plurality of lift pins 110. In one embodiment, the set of ring segments 130 is not in contact with one another prior to providing the vacuum suction on the backside of the wafer 10, and the set of ring segments 130 is in direct contact with one another after forming the vacuum seal. The time delay between step 1130 and step 1140 may be approximately the time it takes for formation of the vacuum seal by an assembly of the set of ring segments 130, and may be in a range from $1.0 \times 10^{-7}$ second to about 3 seconds.

In one embodiment, the set of ring segments 130 is located in an annular cavity 127 of a first vacuum seal assembly 100 selected from the plurality of vacuum seal assemblies 100. In one embodiment, the annular cavity 127 is vertically bounded at top by a first annular sloping sliding surface 122 of a confinement matrix structure (120, 140) of the first vacuum seal assembly 100. In one embodiment, each ring segment 130 within the set of ring segments 130 slides inward and upward along the first annular sloping sliding surface 122 during formation of the vacuum seal. In one embodiment, the set of ring segments 130 is induced to contact, and laterally surround, the one of the plurality of lift pins 110 by momentum transfer by a gas flow upward around the one of the plurality of lift pins 110.

In one embodiment, the annular cavity 127 is vertically bounded at bottom by a second annular sloping sliding surface 142 of the confinement matrix structure (120, 140). In one embodiment, the set of ring segments 130 can be induced to slide outward and downward along the second annular sloping sliding surface 142 after processing the wafer.

Referring to all drawings and according to various embodiments of the present disclosure, a semiconductor processing apparatus 1000 comprising a wafer chuck 200 configured to hold a wafer 10 on a top surface thereof; a plurality of lift-pin holes 229 that vertically extend through a chuck body 210 of the wafer chuck 200; a plurality of lift pins 110 that are located in the plurality of lift-pin holes 229; a plurality of vacuum seal assemblies 100 laterally surrounding a bottom portion of a respective one of the plurality of lift pins 110, wherein each vacuum seal assembly 100 within the plurality of vacuum seal assemblies 100 comprises a respective set of ring segments 130 that are configured to be assembled into a respective contiguous structure under a condition of an upward gas flow within a respective lift-pin hole 229 selected from the plurality of lift-pin holes 229.

In one embodiment, the respective set of ring segments 130 is configured to remain as the respective contiguous structure under a condition of a full or partial vacuum within the respective lift-pin hole 229 selected from the plurality of lift-pin holes 229. In one embodiment, the respective set of ring segments 130 is configured to separate from one another to provide multiple disjoined structures under a condition of equal pressure between a volume inside the respective lift-pin hole 229 selected from the plurality of lift-pin holes 229 and a volume underlying the set of ring segments 130. In one embodiment, the respective set of ring segments 130 is configured to move downward and to move outward during a transition from the respective contiguous structure to the multiple disjoined structures. In one embodiment, the respective set of ring segments 130 is configured to move upward and to move inward during assembly into the respective contiguous structure.

In one embodiment, the semiconductor processing apparatus 1000 comprises a wafer stage 300 configured to provide a two-dimensional lateral movement of the wafer chuck 200 along a first horizontal direction hd1 and along a second horizontal direction hd2. In one embodiment, the plurality of vacuum seal assemblies 100 is attached to a bottom surface of the wafer chuck 200 and is configured to move with the wafer chuck 200 during movement of the wafer 10 along the first horizontal direction hd1 and along the second horizontal direction hd2.

In one embodiment, the top surface of the wafer chuck 200 includes a plurality of vacuum grooves (251, 261) that is connected to vacuum pumping manifolds (252, 262, 253, 263) which are embedded in the wafer chuck 200. In one embodiment, the semiconductor processing apparatus 1000 comprises: a laser system 600 configured to generate a laser beam; an illumination optics system 700 comprising a reticle 710 therein and configured to guide the laser beam through the reticle 710; and a projection optics system 800 located between the illumination optics system 700 and the wafer chuck 200 and configured to focus the laser beam onto a respective exposure field on the wafer 10.

According to another aspect of the present disclosure, a semiconductor processing apparatus 1000 may include a wafer chuck 200 configured to hold a wafer 10 on a top surface thereof; a plurality of lift-pin holes 229 that vertically extend through a chuck body 210 of the wafer chuck 200; a plurality of lift pins 110 that are located in the plurality of lift-pin holes 229; and a plurality of vacuum seal assemblies 100 laterally surrounding a bottom portion of a respective one of the plurality of lift pins 110. Each vacuum seal assembly 100 within the plurality of vacuum seal assemblies 100 may include: a respective confinement matrix structure (120, 140) including a respective vertically-extending opening 129 that is aligned to a respective overlying lift-pin hole 229 selected from the plurality of lift-pin holes 229 and a respective annular cavity 127 connected to, and laterally surrounding, the respective vertically-extending opening 129; and a respective set of ring segments 130 located in the respective annular cavity 127 and configured to form a contiguous structure in a respective sealing state and configured to form multiple disjoined structures in a respective non-sealing state.

In one embodiment, the plurality of lift pins 110 vertically extends through the vertically-extending openings 129 of the confinement matrix structures (120, 140); each of the set of ring segments 130 is in direct contact with a respective segment of a cylindrical sidewall of a respective lift pin 110 in the respective sealing state; and each of the set of ring segments 130 is not in direct contact with the respective lift pin 110 in the respective non-sealing state. In one embodiment, the respective annular cavity 127 is vertically bounded at top by a respective tapered top surface 131 that is configured to guide an inward-and-upward sliding movement of each ring segment 130 therein during a transition into the respective sealing state; and the respective annular cavity 127 is vertically bounded at bottom by a respective second annular sloping sliding surface 142 that is configured to guide an outward-and-downward sliding movement of each ring segment 130 therein during a transition to the respective non-sealing state.

In one embodiment, the respective confinement matrix structure (120, 140) comprises: a respective contoured cap structure 120 including an first annular sloping sliding surface 122 that tapers downward with a lateral distance from the respective vertically-extending opening 129; and a respective contoured base structure 140 including an annular sloping top surface 142 that tapers downward with the lateral distance from the respective vertically-extending opening 129. In one embodiment, the respective set of ring segments 130 is configured to contact the first annular sloping sliding surface 122 and not to contact the second annular sloping sliding surface 142 in the respective sealing state; and the respective set of ring segments 130 is configured to contact the second annular sloping sliding surface 142 and not to contact the first annular sloping sliding surface 122 in the respective non-sealing state.

In one embodiment, the respective contoured base structure 140 has a respective base opening; a respective lift pin

110 vertically extends through the respective base opening; and the respective set of ring segments 130 overlies more than 50% of a total area of the respective base opening that is not occupied by the respective lift pin 110 while the respective set of ring segments 130 is in the respective non-sealing state.

According to yet another aspect of the present disclosure, a semiconductor processing apparatus 1000 may include: a wafer chuck 200 configured to hold a wafer 10 on a top surface thereof; a plurality of lift-pin holes 229 that vertically extend through a chuck body 210 of the wafer chuck 200; a plurality of lift pins 110 that are located in the plurality of lift-pin holes 229; and a plurality of vacuum seal assemblies 100 laterally surrounding a bottom portion of a respective one of the plurality of lift pins 110. Each vacuum seal assembly 100 within the plurality of vacuum seal assemblies 100 comprises a respective set of ring segments 130 configured to be assembled into a respective contiguous structure providing a vacuum seal against a respective lift pin 110 hole under a condition of a positive pressure differential between a volume underlying the vacuum seal assembly 100 and a respective lift-pin hole 229 selected from the plurality of lift-pin holes 229.

In one embodiment, each vacuum seal assembly 100 within the plurality of vacuum seal assemblies 100 may include a respective confinement matrix structure (120, 140) including a respective vertically-extending opening 129 that may be aligned to a respective overlying lift-pin hole 229 selected from the plurality of lift-pin holes 229 and a respective annular cavity 127 connected to, and laterally surrounding, the respective vertically-extending opening 129; and wherein the respective set of ring segments 130 is located partly within a volume of the respective annular cavity 127. In one embodiment, the respective set of ring segments 130 may be located partly within a volume of the respective vertically-extending opening 129; and a volume fraction of the respective set of ring segments 130 located within the volume of the respective vertically-extending opening 129 may be greater during formation of the respective contiguous structure in a sealing state than in a non-sealing state in which the respective set of ring segments 130 is not in contact with one another. In one embodiment, the respective confinement matrix structure (120, 140) may include: a respective contoured cap structure 120 including an first annular sloping sliding surface 122 that tapers downward with a lateral distance from the respective vertically-extending opening 129; and a respective contoured base structure 140 including an annular sloping top surface 142 that tapers downward with the lateral distance from the respective vertically-extending opening 129. In one embodiment, each of the ring segments 130 may include: an upper tapered sliding surface 131 having a first taper angle $\alpha 1$ within respect to a vertical direction vd in a range from 15 degrees to 60 degrees and having a first upper edge 132 that has a first radius of curvature Rc1 around a respective first center point CP1 that is a center of an arc that coincides with the first upper edge 132; and a lower tapered sliding surface 133 having a second taper angle $\alpha 2$ with respect to the vertical direction vd in a range from 15 degrees to 60 degrees and having a second upper edge 134 that has a second radius of curvature Rc2 around a respective second center point CP2, wherein the first upper edge 132 extends by a first azimuthal angle of $2\lambda/n$ around the first center point CP1 and the second upper edge 134 extends by a second azimuthal angle less than $2\lambda/n$ around the second center point CP2, n being an integer greater than 1.

According to yet another aspect of the present disclosure, a method of operating an apparatus may be provided, wherein the method may include: providing a semiconductor processing apparatus 1000 comprising a wafer chuck 200 configured to hold a wafer 10 on a top surface thereof, wherein a plurality of lift-pin holes 229 vertically extends through a chuck body 210 of the wafer chuck 200, a plurality of lift pins 110 are located in the plurality of lift-pin holes 229, and a plurality of vacuum seal assemblies 100 laterally surrounds a bottom portion of a respective one of the plurality of lift pins 110; disposing a wafer 10 on the top surface of the wafer chuck 200; pulling the wafer 10 toward the top surface of the wafer chuck 200 by providing a vacuum suction on a backside of the wafer 10; and forming a vacuum seal in one of the plurality of vacuum seal assemblies 100 by assembling a set of ring segments 130 selected from the sets of ring segments 130 into a contiguous structure under a condition of an upward gas flow within a respective lift-pin hole 229 selected from the plurality of lift-pin holes 229.

In one embodiment, the method may further include the step of maintaining the respective set of ring segments 130 as the respective contiguous structure under a condition of a full or partial vacuum within the respective lift-pin hole 229 selected from the plurality of lift-pin holes 229. In one embodiment, the method may further include the step of separating the respective set of ring segments 130 from one another to provide multiple disjoined structures under a condition of equal pressure between a volume inside the respective lift-pin hole 229 selected from the plurality of lift-pin holes 229 and a volume underlying the set of ring segments 130. In one embodiment, the method may further include the step of moving the respective set of ring segments 130 downward and outward during a transition from the respective contiguous structure to the multiple disjoined structures. In one embodiment, the respective set of ring segments 130 moves upward and inward toward a respective lift pin 110 during assembly into the respective contiguous structure. In one embodiment, the semiconductor processing apparatus 1000 may include a wafer stage 300 configured to provide a two-dimensional lateral movement of the wafer chuck 200 along a first horizontal direction and along a second horizontal direction, wherein the method may include horizontally moving the wafer chuck 200 after the wafer 10 is pulled toward the top surface of the wafer chuck 200. In one embodiment, the plurality of vacuum seal assemblies 100 may be attached to a bottom surface of the wafer chuck 200; and the plurality of vacuum seal assemblies 100 moves with the wafer chuck during movement of the wafer 10 along the first horizontal direction and along the second horizontal direction. In one embodiment, the top surface of the wafer chuck 200 includes a plurality of vacuum grooves 251, 261 that is connected to vacuum pumping manifolds 250, 260 which are embedded in the wafer chuck 200; and the plurality of vacuum grooves 251, 261 functions as a conduit for vacuum suction while the wafer 10 is pulled toward the top surface of the wafer chuck 200. In one embodiment, the semiconductor processing apparatus 1000 may include: a laser system 600 configured to generate a laser beam; an illumination optics system 700 comprising a reticle 710 therein and configured to guide the laser beam through the reticle 710; and a projection optics system 800 located between the illumination optics system 700 and the wafer chuck 200 and configured to focus the laser beam onto a respective exposure field on the wafer 10;

and wherein the method may also include performing a lithographic exposure process on a photoresist layer on the wafer 10.

According to yet another aspect of the present disclosure, a method of operating an apparatus may be provided, wherein the method may include the steps of: providing a semiconductor processing apparatus 1000 comprising a wafer chuck 200 configured to hold a wafer 10 on a top surface thereof, wherein a plurality of lift-pin holes 229 vertically extends through a chuck body 210 of the wafer chuck 200, a plurality of lift pins 110 are located in the plurality of lift-pin holes 229, a plurality of vacuum seal assemblies 100 laterally surrounding a bottom portion of a respective one of the plurality of lift pins 110, and a plurality of vacuum seal assemblies 100 each comprising a respective set of ring segments 130 is located around bottom portions of the plurality of lift pins 110; and disposing a wafer 10 over the wafer chuck 200 while the plurality of vacuum seal assemblies 100 is not in direct contact with the plurality of lift pins 110; and pulling the wafer 10 toward the top surface of the wafer chuck 200 by providing a vacuum suction on a backside of the wafer 10; and forming a vacuum seal in one of the plurality of vacuum seal assemblies 100 by inducing a set of ring segments 130 within the plurality of vacuum seal assemblies 100 to contact, and laterally surround, one of the plurality of lift pins 110.

In one embodiment, the set of ring segments 130 is not in contact with one another prior to providing the vacuum suction on the backside of the wafer 10; and the set of ring segments 130 is in direct contact to one another after forming the vacuum seal. In one embodiment, each vacuum seal assembly 100 within the plurality of vacuum seal assemblies 100 comprises a respective confinement matrix structure (120, 140) including a respective vertically-extending opening 129 that is aligned to a respective overlying lift-pin hole 229 selected from the plurality of lift-pin holes 229 and a respective annular cavity 127 connected to, and laterally surrounding, the respective vertically-extending opening 129; and the set of ring segments 130 is located in an annular cavity 127 of a first vacuum seal assembly 100 selected from the plurality of vacuum seal assemblies 100. In one embodiment, the annular cavity 127 is vertically bounded at top by a first annular sloping sliding surface 122 of a confinement matrix structure (120, 140) of the first vacuum seal assembly 100; and each ring segment 130 within the set of ring segments 130 slides inward and upward along the first annular sloping sliding surface 122 during formation of the vacuum seal. In one embodiment, the annular cavity 127 is vertically bounded at bottom by a second annular sloping sliding surface 142 of the confinement matrix structure (120, 140); and the method includes inducing the set of ring segments 130 to slide outward and downward along the second annular sloping sliding surface 142 after processing the wafer 10. In one embodiment, the set of ring segments 130 is induced to contact, and laterally surround, the one of the plurality of lift pins 110 by momentum transfer by a gas flow upward around the one of the plurality of lift pins 110.

The various embodiments of the present disclosure can provide a semiconductor processing apparatus 1000 including a wafer chuck 200 and at least one vacuum seal assembly 100 configured to provide a vacuum seal around a respective lift pin 110 through the chuck body 210 of the wafer chuck 200. High warpage wafers that cannot be normally processed due to formation of gaps 227 between the backside of the wafer 10 and the top surface of the wafer chuck 200 can be processed by forming a vacuum seal in one or more vacuum seal assemblies to prevent leakage of ambient gas into the vacuum manifold (250, 260), and provide maintenance of vacuum suction on the backside of the wafer 10 throughout a processing step within the semiconductor processing apparatus 1000. Thus, the various embodiments of the present disclosure provide processing on high warpage wafers that would not be possible without use of the at least one vacuum seal assembly 100 of the present disclosure.

The foregoing outlines features of several embodiments so that those skilled in the art may better understand the aspects of the present disclosure. Each embodiment described using the term "comprises" also inherently discloses additional embodiments in which the term "comprises" is replaced with "consists essentially of" or with the term "consists of," unless expressly disclosed otherwise herein. Whenever two or more elements are listed as alternatives in a same paragraph of in different paragraphs, a Markush group including a listing of the two or more elements is also impliedly disclosed. Whenever the auxiliary verb "can" is used in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor processing apparatus, comprising:
a wafer chuck configured to hold a wafer on a top surface thereof;
a plurality of lift-pin holes that vertically extend through a chuck body of the wafer chuck;
a plurality of lift pins located in the plurality of lift-pin holes;
a vacuum seal assembly laterally surrounding a bottom portion of a first lift pin among the plurality of lift pins, wherein a vacuum seal assembly within the plurality comprises:
a confinement matrix structure including a vertically-extending opening aligned to an overlying lift-pin hole among the plurality of lift-pin holes and an annular cavity connected to, and laterally surrounding, the vertically-extending opening; and
a set of ring segments located at least partly within the annular cavity and configured, in a sealing state, to assemble into a contiguous annulus that laterally surrounds and directly contacts the first lift pin and, in a non-sealing state, to be mutually spaced apart and out of contact with the first lift pin, wherein a positive pressure differential between a volume underlying the vacuum seal assembly and the overlying lift-pin hole induces an upward gas flow through the vertically-extending opening that drives the set of ring segments from the non-sealing state into the sealing state.

2. The semiconductor processing apparatus of claim 1, wherein the contiguous annulus remains as a contiguous structure under a condition of a full or partial vacuum within the lift-pin hole.

3. The semiconductor processing apparatus of claim 1, wherein the set of ring segments separates from one another to provide multiple disjoined structures under a condition of equal pressure between a volume inside the lift-pin hole and a volume underlying the set of ring segments.

4. The semiconductor processing apparatus of claim 3, wherein the set of ring segments moves downward and outward during a transition from the contiguous annulus to the multiple disjoined structures.

5. The semiconductor processing apparatus of claim 1, wherein the set of ring segments moves upward and inward during assembly into the contiguous structure annulus.

6. The semiconductor processing apparatus of claim 1, wherein the vacuum seal assembly is attached to a bottom surface of the wafer chuck.

7. The semiconductor processing apparatus of claim 1, wherein the top surface of the wafer chuck includes a plurality of vacuum grooves that is connected to vacuum pumping manifolds which are embedded in the wafer chuck, and wherein the contiguous annulus formed by the set of ring segments is maintained as long as at least one of the vacuum pumping manifolds is under vacuum.

8. The semiconductor processing apparatus of claim 1, wherein a volume fraction of the set of ring segments within the vertically-extending opening is greater in the sealing state than in the non-sealing state.

9. A semiconductor processing apparatus, comprising:
a wafer chuck configured to hold a wafer on a top surface thereof;
a plurality of lift-pin holes that vertically extend through a chuck body of the wafer chuck;
a plurality of lift pins located in the plurality of lift-pin holes; and
vacuum seal assembly laterally surrounding a bottom portion of a lift pin among the plurality of lift pins, wherein the vacuum seal assembly comprises:
a confinement matrix structure including a vertically-extending opening aligned to an overlying lift-pin hole among the plurality of lift-pin holes and an annular cavity connected to, and laterally surrounding, the vertically-extending opening, the confinement matrix structure comprising a contoured cap structure providing a first annular sloped sliding surface and a contoured base structure providing a second annular sloped sliding surface and a base opening through which the lift pin vertically extends, the contoured base structure being affixed to the contoured cap structure by at least one fastening element; and
a set of ring segments located at least partly within the annular cavity and configured to form a contiguous structure annulus in a sealing state and to form multiple disjoined structures in a non-sealing state, the contiguous annulus laterally surrounding and contacting the lift pin;
wherein a positive pressure differential between a volume underlying the vacuum seal assembly and the overlying lift-pin hole induces an upward gas flow through the vertically-extending opening that drives the set of ring segments from the non-sealing state into the sealing state; and wherein each ring segment includes an upper tapered sliding surface having a first taper angle $\alpha_1$ with respect to a vertical direction and a lower tapered sliding surface having a second taper angle $\alpha_2$ with respect to the vertical direction.

10. The semiconductor processing apparatus of claim 9, wherein:

the lift pin vertically extends through the vertically-extending openings of a confinement matrix structure;

each of the set of ring segments is in direct contact with a respective segment of a cylindrical sidewall of the lift pin in the sealing state; and each of the set of ring segments is not in direct contact with the lift pin in the non-sealing state.

11. The semiconductor processing apparatus of claim 9, wherein:

the annular cavity is vertically bounded at top by a first annular sloping sliding surface that is configured to guide an inward-and-upward sliding movement of each ring segment during a transition into the sealing state; and the annular cavity is vertically bounded at bottom by a second annular sloping sliding surface that is configured to guide an outward-and-downward sliding movement of each ring segment during a transition to the non-sealing state.

12. The semiconductor processing apparatus of claim 9, wherein the confinement matrix structure comprises: a contoured cap structure including a first annular sloping sliding surface that tapers downward with a lateral distance from the vertically-extending opening; and a contoured base structure including an annular sloping top surface that tapers downward with the lateral distance from the vertically-extending opening.

13. The semiconductor processing apparatus of claim 12, wherein:

the set of ring segments contacts the first annular sloping sliding surface and does not contact the second annular sloping sliding surface in the sealing state; and the set of ring segments contacts the second annular sloping sliding surface and does not contact the first annular sloping sliding surface in the non-sealing state.

14. The semiconductor processing apparatus of claim 13, wherein: the contoured base structure has a base opening; a lift pin vertically extends through the base opening; and the set of ring segments overlies more than 50% of a total area of the base opening that is not occupied by the lift pin while the set of ring segments is in the non-sealing state.

15. A method of operating a semiconductor processing apparatus, the method comprising:

providing a semiconductor processing apparatus comprising a wafer chuck configured to hold a wafer on a top surface thereof, wherein a plurality of lift-pin holes vertically extends through a chuck body of the wafer chuck, a plurality of lift pins are located in the plurality of lift-pin holes, and a vacuum seal assembly laterally surrounds a bottom portion of a first lift pin among the plurality of lift pins and includes a confinement matrix structure having a vertically-extending opening aligned to an overlying lift-pin hole and an annular cavity laterally surrounding the vertically-extending opening and a set of ring segments located at least partly within the annular cavity;

disposing a wafer on the top surface of the wafer chuck;

pulling the wafer toward the top surface of the wafer chuck by providing a vacuum suction on a backside of the wafer; and forming, in the vacuum seal assembly, a vacuum seal around the first lift pin by inducing, with a positive pressure differential between a volume underlying the vacuum seal assembly and the overlying lift-pin hole, an upward gas flow through the vertically-extending opening that drives the set of ring segments from a non-sealing state in which the ring segments are mutually spaced apart and out of contact with the first lift pin into a sealing state in which the ring segments assemble into a contiguous annulus that laterally surrounds and contacts the first lift pin.

16. The semiconductor processing apparatus of claim 9, wherein centers of curvature for the ring segments coincide in the sealing state and differ in the non-sealing state, and a radial offset between a first center and a second center corresponds to a difference between a second radius of curvature $Rc_2$ and a first radius of curvature $Rc_1$ that lies within 0.5 mm to 2.0 mm.

17. The method of claim 15, wherein the set of ring segments is assembled into the contiguous annulus by transfer of upward momentum to the set of ring segments during the upward gas flow through the vertically-extending opening.

18. The method of claim 15, wherein the set of ring segments is not in direct contact with one another, and is not in direct contact with the first lift pin prior to providing the vacuum suction on the backside of the wafer.

19. The method of claim 15, further comprising: performing a processing step on the wafer; and deactivating the vacuum suction on the backside of the wafer after performing the processing step on the wafer, wherein the contiguous annulus is transformed into a set of non-contacting discrete structures in which the set of ring segments is not in direct contact with one another and does not contact the first lift pin.

20. The method of claim 15, wherein:

the semiconductor processing apparatus comprises a lithographic exposure apparatus that comprises: a laser system configured to generate a laser beam;

an illumination optics system comprising a reticle therein and configured to guide the laser beam through the reticle; and a projection optics system located between the illumination optics system and the wafer chuck and configured to focus the laser beam onto a respective exposure field on the wafer; and the method further comprises lithographically exposing a photoresist layer on a top surface of the wafer after providing the vacuum suction on the backside of the wafer.

* * * * *